United States Patent
Shih

(10) Patent No.: US 12,315,774 B2
(45) Date of Patent: May 27, 2025

(54) SEMICONDUCTOR STRUCTURE HAVING HEAT DISSIPATION STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 497 days.

(21) Appl. No.: 17/857,223

(22) Filed: Jul. 5, 2022

(65) Prior Publication Data

US 2024/0014089 A1  Jan. 11, 2024

(51) Int. Cl.
 *H01L 23/31* (2006.01)
 *H01L 23/367* (2006.01)
 *H01L 23/48* (2006.01)

(52) U.S. Cl.
 CPC ........ *H01L 23/3142* (2013.01); *H01L 23/367* (2013.01); *H01L 23/481* (2013.01)

(58) Field of Classification Search
 CPC .. H01L 23/3142; H01L 23/367; H01L 23/481
 See application file for complete search history.

(56) References Cited

U.S. PATENT DOCUMENTS

| | | | | |
|---|---|---|---|---|
| 9,012,811 B2 * | 4/2015 | White | ....................... | H05B 3/28 219/547 |
| 9,035,445 B2 * | 5/2015 | Lin | ....................... | H01L 23/488 257/E23.141 |
| 9,466,575 B2 * | 10/2016 | Tomita | ................. | H01L 23/5226 |
| 2007/0170591 A1 * | 7/2007 | Yamanoue | ............ | H01L 23/585 257/E21.244 |

(Continued)

FOREIGN PATENT DOCUMENTS

CN      103178047 B     11/2018
JP      2002261455 A *  9/2002   ..... H01L 224/16225

(Continued)

OTHER PUBLICATIONS

Pad for ground conductors are arranged in the intersections of wiring conductors formed in the shape of lattice on the surface of an insulated substrate. The pads (10,11) for power supply and signal conductors are arranged within the lattice formed by the wiring conductors. (Year: 2002).*

(Continued)

*Primary Examiner* — William B Partridge
*Assistant Examiner* — Alexandre X Ramirez
(74) *Attorney, Agent, or Firm* — Xuan Zhang

(57) ABSTRACT

A semiconductor structure is provided. The semiconductor structure includes a first substrate, a first dielectric layer disposed on the first substrate, a first passivation layer disposed on the first dielectric layer, a second substrate disposed on the first passivation layer, and a second substrate disposed on the first passivation layer. The semiconductor structure further includes a first seal ring embedded within the first dielectric layer and surrounds a circuit region of the first dielectric layer. The semiconductor structure further includes a thermal conductive structure embedded within the first passivation layer, wherein the thermal conductive structure is connected with the first seal ring through a first connecting structure.

8 Claims, 25 Drawing Sheets

(56) References Cited

U.S. PATENT DOCUMENTS

| | | | | |
|---|---|---|---|---|
| 2009/0321890 | A1* | 12/2009 | Jeng | H01L 23/562 |
| | | | | 257/E23.193 |
| 2011/0215457 | A1* | 9/2011 | Park | H01L 25/50 |
| | | | | 257/E23.101 |
| 2015/0084164 | A1* | 3/2015 | Tomita | H01L 23/5226 |
| | | | | 257/620 |
| 2019/0363079 | A1* | 11/2019 | Thei | H01L 24/89 |
| 2020/0229294 | A1* | 7/2020 | Thibado | H05K 1/181 |
| 2020/0312817 | A1* | 10/2020 | Wu | H01L 23/53209 |
| 2021/0305200 | A1* | 9/2021 | Lin | B23K 26/362 |
| 2022/0013502 | A1* | 1/2022 | Lee | H01L 23/5385 |
| 2023/0021125 | A1* | 1/2023 | Ohba | H01L 25/50 |
| 2023/0062027 | A1* | 3/2023 | Chang | H01L 23/481 |
| 2023/0067714 | A1* | 3/2023 | Chang | H01L 23/10 |
| 2023/0170249 | A1* | 6/2023 | Chuang | H01L 23/481 |
| | | | | 257/48 |

FOREIGN PATENT DOCUMENTS

| | | |
|---|---|---|
| TW | 200411902 A | 7/2004 |
| TW | 201327740 A | 7/2013 |
| TW | 202121618 A | 6/2021 |

OTHER PUBLICATIONS

Office Action and the search report mailed on Jan. 19, 2024 related to Taiwanese Application No. 112114423.
Office Action and the search report mailed on Mar. 29, 2024 related to Taiwanese Application No. 112114423.

* cited by examiner

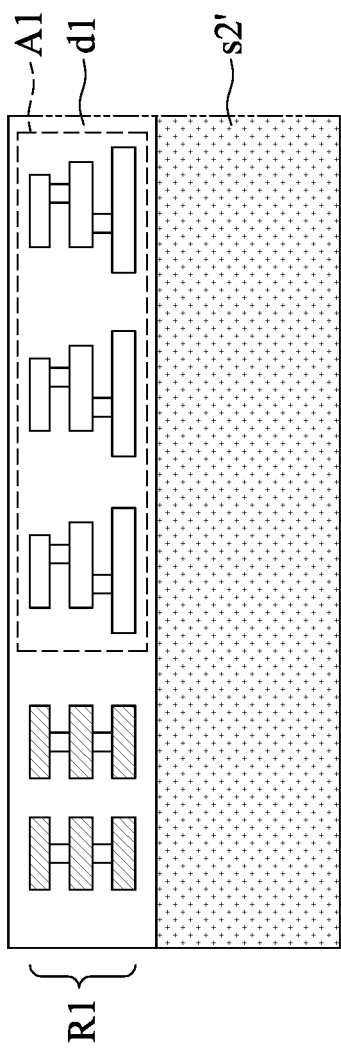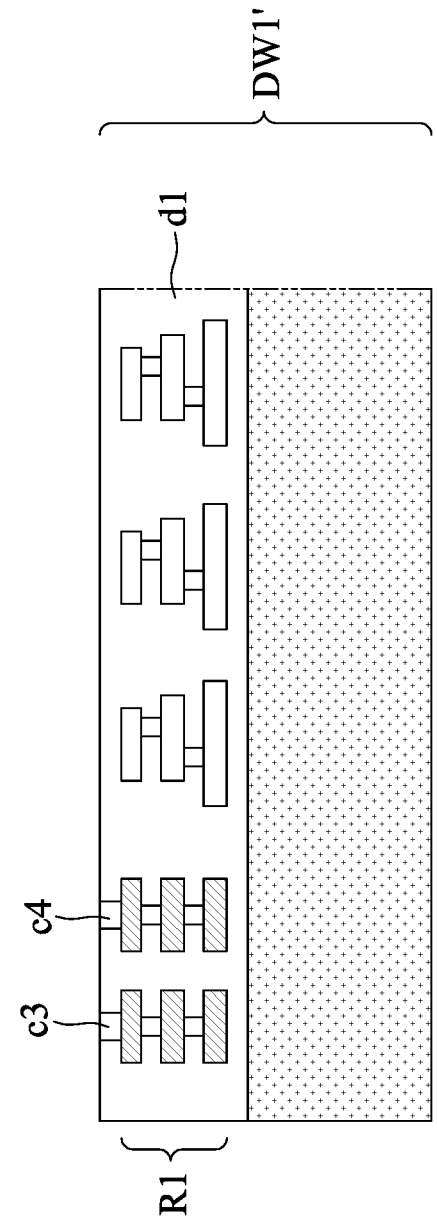

SEMICONDUCTOR STRUCTURE HAVING HEAT DISSIPATION STRUCTURE

TECHNICAL FIELD

The present disclosure relates to a semiconductor structure, and more particularly, to a semiconductor structure having a heat dissipation structure.

DISCUSSION OF THE BACKGROUND 3D stacked chip packages front challenges in dissipating heat. For example, 3D stacked integrated circuit (IC) packages such as those with high bandwidth memory (HBM) may include application of a thermal interface material (TIM) between stacked chips and/or cavities between dies for lateral heat path dissipation. Because each chip within a 3D stacked chip package needs to be considered individually, creating a heat dissipation path for each chip is desirable for robust thermal dissipation and device reliability.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a first substrate, a first dielectric layer disposed on the first substrate, a first passivation layer disposed on the first dielectric layer, a second substrate disposed on the first passivation layer, and a second substrate disposed on the first passivation layer. The semiconductor structure further includes a first seal ring embedded within the first dielectric layer and surrounding a circuit region of the first dielectric layer. The semiconductor structure further includes a thermal conductive structure embedded within the first passivation layer, wherein the thermal conductive structure is connected with the first seal ring through a first connecting structure.

Another aspect of the present disclosure provides a semiconductor structure. The semiconductor structure includes a first wafer having a first dielectric layer and a first substrate, and a second wafer bonded to the first wafer and having a first passivation layer and a second substrate, wherein the second wafer comprises a heat dissipation structure in contact with a first seal ring embedded within the first dielectric layer of the first wafer.

Another aspect of the present disclosure provides a method of manufacturing a semiconductor structure having a heat dissipation structure. The method includes forming a thermal conductive structure embedded within a first passivation layer of a first wafer, and forming a plurality of conductive vias penetrating a first substrate of the first wafer and in contact with the thermal conductive structure. The method further includes forming a first connecting structure in contact with the thermal conductive structure and exposed by a surface of the first passivation layer. The method further includes bonding the first connecting structure of the first wafer to a second connecting structure of a second wafer, and bonding the first passivation layer of the first wafer to a first dielectric layer of the second wafer, wherein a first seal ring embedded within the first dielectric layer of the second wafer is thermally connected to the thermal conductive structure through the first connecting structure and the second connecting structure.

In the semiconductor structure proposed in the present disclosure, a heat dissipation structure for a 3D stacked chip package or a wafer-on-wafer structure incorporates the seal rings of individual wafers. The heat dissipation structure as proposed provides an efficient heat dissipation path for each wafer of a 3D stacked chip package or a wafer-on-wafer structure, without introducing additional components or complex structures. Also, the heat dissipation structure as proposed increases the function of the existing seal rings. That is, in addition to the inherent function of the seal ring (i.e., to prevent unintended stress from propagating into the semiconductor element), the heat dissipation structure as proposed utilizes the seal rings for thermal transmission and heat dissipation. The heat dissipation structure as proposed also enhances the structural stability of a 3D stacked chip package or a wafer-on-wafer structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 5E illustrates one stage of a method of manufacturing a semiconductor structure, in accordance with some embodiments of the present disclosure.

FIG. 5F illustrates one stage of a method of manufacturing a semiconductor structure, in accordance with some embodiments of the present disclosure.

DETAILED DESCRIPTION

Figure 1A:
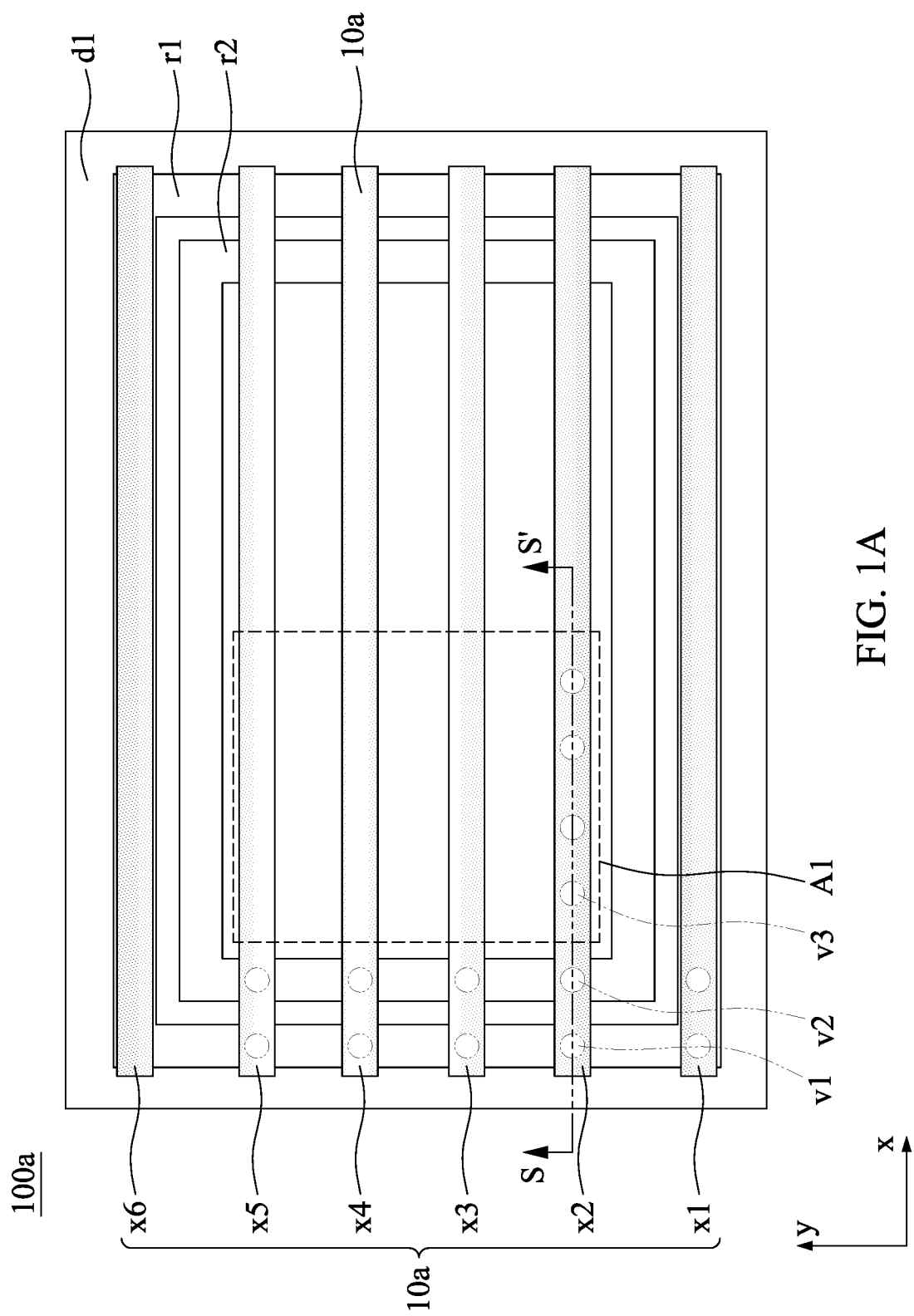
FIG. 1A is a top view of a portion of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a top view of a portion of a semiconductor structure, in accordance with some embodiments of the present disclosure.

FIG. 1A is a top view 100a of a portion of a semiconductor structure, showing components/elements that can be included within two layers of a stacked IC package. The top view 100a includes a dielectric layer d1, seal rings r1 and r2 embedded within the dielectric layer d1, and a thermal conductive structure 10a disposed above the dielectric layer d1.

The thermal conductive structure 10a includes ribs x1, x2, x3, x4, x5, and x6 extending in an X direction. The ribs x1, x2, x3, x4, x5, and x6 are substantially parallel. The ribs x1, x2, x3, x4, x5, and x6 can also be referred to as strips or extensions. Although FIG. 1A shows six ribs, it can be contemplated that the thermal conductive structure may include more than six ribs, or any number thereof between one and six.

The thermal conductive structure 10a can comprise materials of relatively high thermal conductivity. In some embodiments, the thermal conductive structure 10a may comprise, for example, without limitation, silver (Ag), copper (Cu), gold (Au), aluminum-nitride (AlN), silicon-carbide (SiC), aluminum (Al), tungsten (W), zinc (Zn), or any combinations thereof.

One or more conductive vias can be disposed in contact with the thermal conductive structure 10a. For example, conductive vias v1, v2, and v3 can be disposed in contact with the thermal conductive structure 10a.

The seal ring r1 surrounds a periphery of the dielectric layer d1. The seal ring r2 surrounds a periphery of the dielectric layer d1. The seal ring r1 is surrounded by the seal ring r2.

The seal rings r1 and r2 can surround a semiconductor element (not shown) disposed within an active region of a chip. For example, the seal rings r1 and r2 can surround a circuit region A1. By surrounding the active region with a seal ring, it is possible to prevent unintended stress from propagating into the semiconductor element during chemical mechanical polishing (CMP) or dicing and thus prevent breakage of the layer in which semiconductor elements are embedded and/or delamination between adjacent layers of a stacked IC package. The seal rings r1 and r2 can prevent stress from propagating into the semiconductor element within the circuit region A1.

The seal rings r1 and r2 can include copper (Cu) or any other suitable materials. In some embodiments, the seal rings r1 and r2 can each include a multilayered structure. In some embodiments, the seal rings r1 and r2 can each include a barrier metal layer (not shown) encapsulating the backbones of the seal rings r1 and r2. In some embodiments, the barrier metal layer may comprise, for example, without limitation, tantalum (Ta), tantalum nitride (TaN), tungsten (W), tungsten nitride (WN), tungsten silicide (WSi), titanium (Ti), titanium nitride (TiN), and titanium silicon nitride (TiSiN).

The ribs x2, x3, x4, and x5 can each intersect with the seal rings r1 and r2 from a top view perspective. The ribs x1 and x6 can partially overlap with the seal ring r2 from a top view perspective.

Although not shown in FIG. 1A, the rib x1 can connect with the seal rings r1 and r2 through interlayer connection. Similarly, the ribs x2, x3, x4, x5, and x6 can connect with the seal rings r1 and r2 through interlayer connection. In some embodiments, the ribs x1, x2, x3, x4, x5, and x6 can electrically connect with the seal rings r1 and r2. In some embodiments, the ribs x1, x2, x3, x4, x5, and x6 can thermally connect with the seal rings r1 and r2.

Figure 1B:
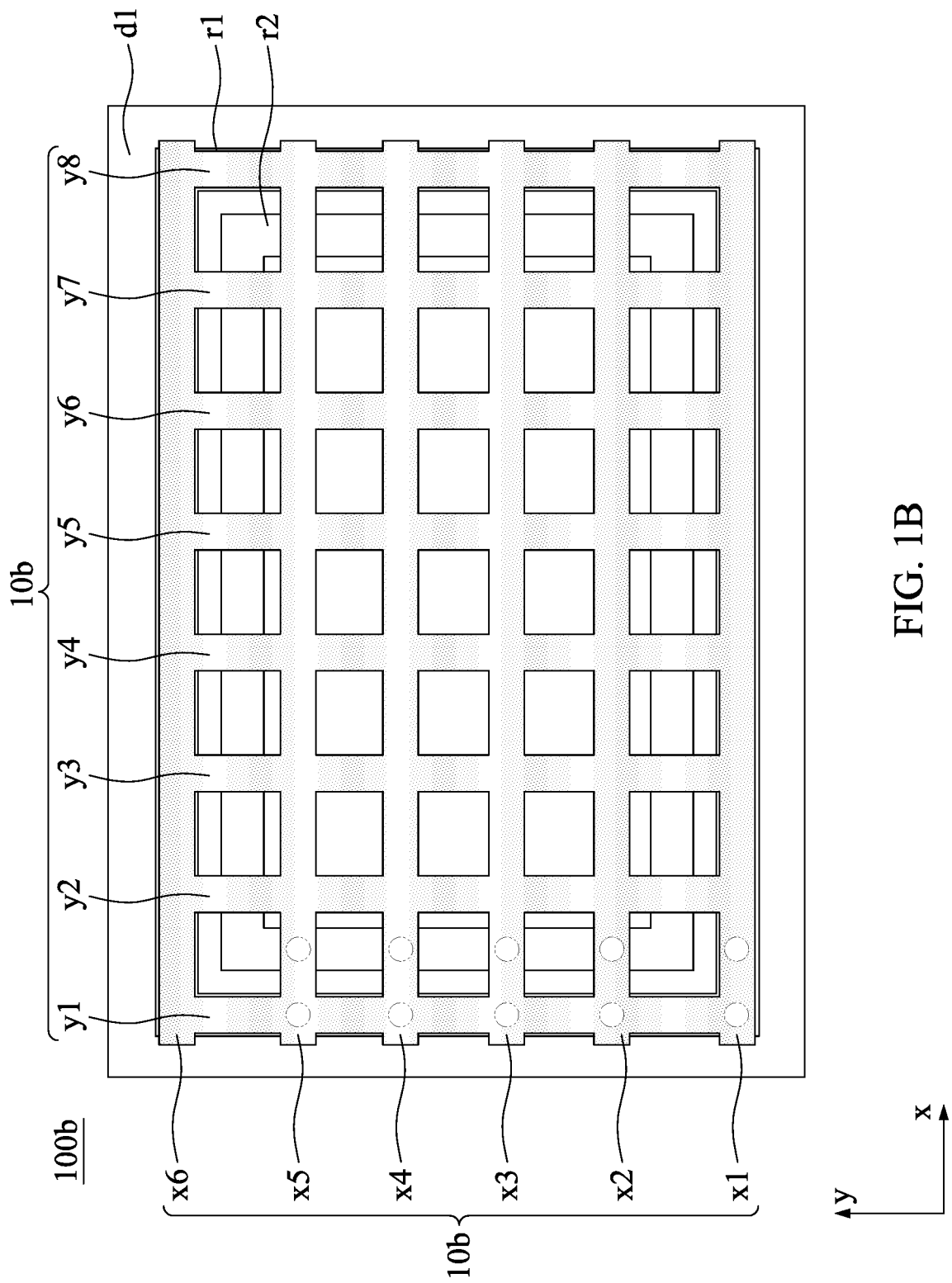
FIG. 1B is a top view of a portion of a semiconductor structure, in accordance with some embodiments of the present disclosure.

FIG. 1B is a top view of a portion of a semiconductor structure, in accordance with some embodiments of the present disclosure.

FIG. 1B is a top view 100b of a portion of a semiconductor structure. The top view 100b shows components/elements that can be included within two layers of a stacked IC package. The top view 100b includes a dielectric layer d1, seal rings r1 and r2 embedded within the dielectric layer d1, and a thermal conductive structure 10b disposed above the dielectric layer d1.

The thermal conductive structure 10b includes ribs x1, x2, x3, x4, x5, and x6 extending in an X direction. The ribs x1, x2, x3, x4, x5, and x6 are substantially parallel. The thermal conductive structure 10b further includes ribs y1, y2, y3, y4, y5, y6, y7, and y8 extending in a Y direction. The ribs y1, y2, y3, y4, y5, y6, y7, and y8 are substantially parallel. The ribs x1, x2, x3, x4, x5, and x6 can be substantially perpendicular to the ribs y1, y2, y3, y4, y5, y6, y7, and y8. The ribs x1, x2, x3, x4, x5, and x6 can also be referred to as strips or extensions. The ribs y1, y2, y3, y4, y5, y6, y7, and y8 can also be referred to as strips or extensions.

Although FIG. 1B shows six ribs extending in a X direction and eight ribs extending in a Y direction, it can be contemplated that the thermal conductive structure 10b may include any other number of ribs extending along the X direction, and any other number of ribs extending along the Y direction.

The thermal conductive structure 10b can comprise materials of relatively high thermal conductivity. The thermal conductive structure 10b can comprise materials similar to those of the thermal conductive structure 10a.

The ribs x2, x3, x4, and x5 can each intersect with the seal rings r1 and r2 from a top view perspective. The ribs x1 and x6 can partially overlap with the seal ring r2 from a top view perspective. The ribs y2, y3, y4, y5, y6, and y7 can each intersect with the seal rings r1 and r2 from a top view perspective. The ribs y1 and y8 can partially overlap with the seal ring r2 from a top view perspective.

Although not shown in FIG. 1B, the rib x1 can connect with the seal rings r1 and r2 through interlayer connection. Similarly, the ribs x2, x3, x4, x5, and x6 can connect with the seal rings r1 and r2 through interlayer connection.

Although not shown in FIG. 1B, the rib y1 can connect with the seal rings r1 and r2 through interlayer connection. Similarly, the ribs y2, y3, y4, y5, y6, y7, and y8 can connect with the seal rings r1 and r2 through interlayer connection.

In some embodiments, the ribs x1, x2, x3, x4, x5, and x6 can electrically connect with the seal rings r1 and r2. In some embodiments, the ribs x1, x2, x3, x4, x5, and x6 can thermally connect with the seal rings r1 and r2. In some embodiments, the ribs y1, y2, y3, y4, y5, y6, y7, and y8 can electrically connect with the seal rings r1 and r2. In some embodiments, the ribs y1, y2, y3, y4, y5, y6, y7, and y8 can thermally connect with the seal rings r1 and r2.

The ribs x1, x2, x3, x4, x5, and x6 and the ribs y1, y2, y3, y4, y5, y6, y7, and y8 can collectively form a mesh structure. The thermal conductive structure 10b can include a mesh profile.

Figure 2:
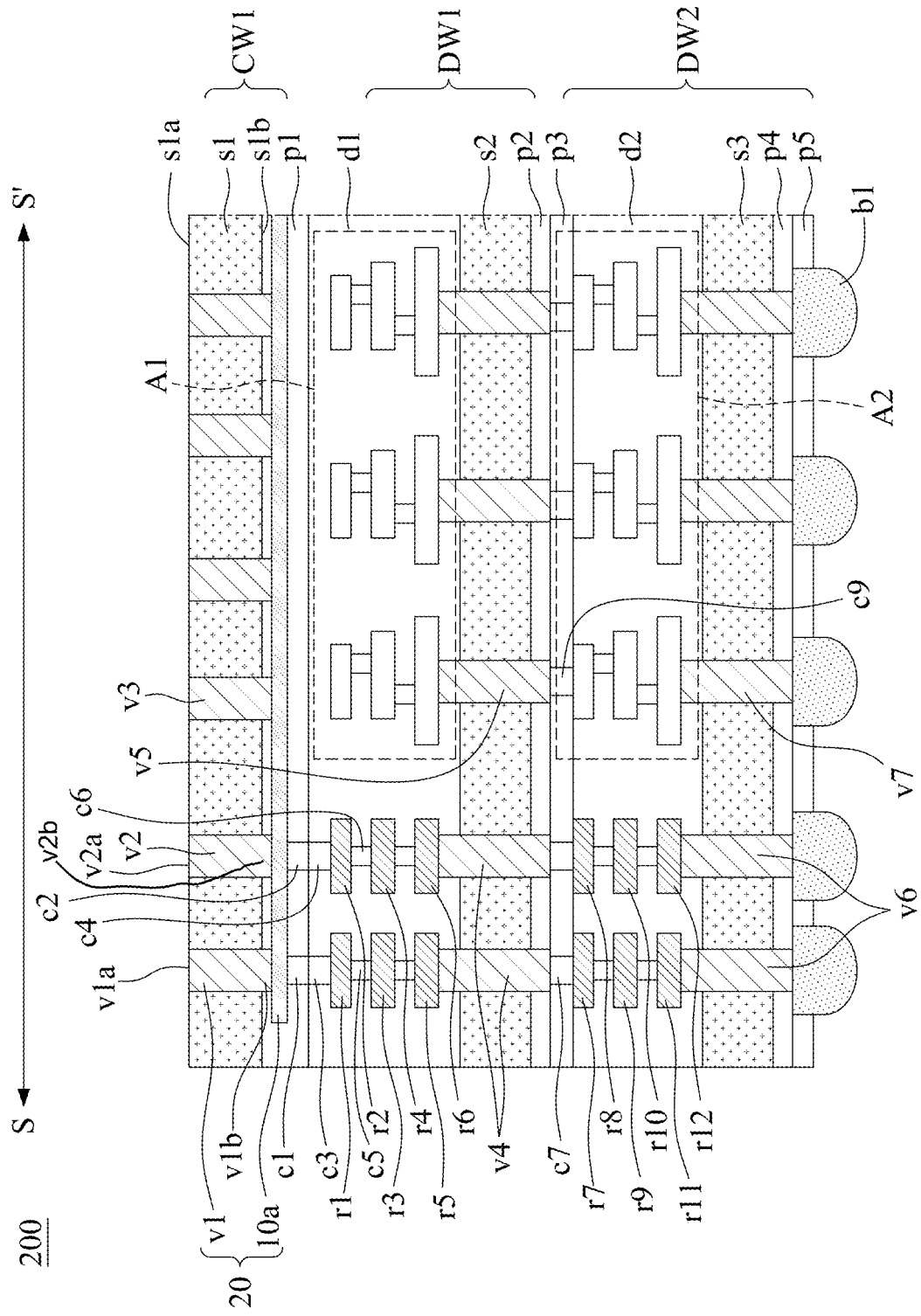
FIG. 2 is a cross section of a semiconductor structure, in accordance with some embodiments of the present disclosure.

FIG. 2 is a cross section of a semiconductor structure, in accordance with some embodiments of the present disclosure. FIG. 2 shows a semiconductor structure 200. The semiconductor structure 200 can correspond to a cross section along the dashed line S-S' shown in FIG. 1A.

The semiconductor structure 200 includes wafers CW1, DW1, and DW2. The wafers CW1, DW1, and DW2 can be vertically stacked. The wafer CW1 can be bonded to the wafer DW1 using hybrid bonding. The wafer DW1 can be bonded to the wafer DW2 using hybrid bonding. Hybrid bonding can use adhesives, such as polyimides, thermocompression, diffusion bonding, pressure joining, and the like, to create metal-to-metal, insulator-to-insulator, and metal-to-insulator bonding to achieve vertically stacked wafers.

In the present disclosure, the "wafer" or "semiconductor wafer" can refer to any type and shape of substrate with semiconductor devices formed thereon. The wafers DW1 and DW2 can be bonded in a "face-to-back" manner. In general, the substrate side can be referred to as the back of a wafer, and the other side in which semiconductor components are formed can be referred to as the face of a wafer. That is, the face of the wafer DW2 is bonded to the back of the wafer DW1.

The wafer CW1 can be referred to as a carrier wafer. The wafer CW1 includes a substrate s1 and a passivation layer p1. The wafer CW1 includes a thermal conductive structure 10a embedded within the passivation layer p1. The passivation layer p1 may be of one or more suitable dielectric materials such as silicon oxide, silicon nitride, low-k dielectrics such as carbon doped oxides, extremely low-k dielectrics such as porous carbon doped silicon dioxide, combinations thereof, or the like. The passivation layer p1 may be formed through a process such as chemical vapor deposition (CVD), although any suitable process may be utilized, and may have a thickness between about 0.5 μm and about 5 μm, such as about 9.25 kÅ.

The wafer CW1 includes conductive vias v1, v2, and v3 embedded within the substrate s1. The conductive vias v1, v2, and v3 can each be referred to as a through silicon via (TSV). The conductive vias v1, v2, and v3 each penetrates the substrate s1. Referring to FIG. 2, the conductive via v1 includes an end v1a exposed by a surface s1a of the substrate s1. The conductive via v1 includes an end v1b embedded within the passivation layer p1. The end v1b of the conductive via v1 is in contact with the thermal conductive structure 10a. The conductive via v1 lands on the thermal conductive structure through the end v1b. Referring to FIG. 2, the end v1b of the conductive via v1 can protrude from the surface s1b of the substrate s1. The end v1b of the conductive via v1 may not be coplanar with the surface s1b.

The end via exposed by the surface s1a of the substrate s1 can facilitate dissipation of accumulated heat from the semiconductor structure 200. The exposed surfaces of the plurality of TSVs embedded within the substrate s1 can facilitate dissipation of accumulated heat from the semiconductor structure 200.

Similarly, the conductive via v2 includes an end v2a exposed by the surface s1a of the substrate s1. The conductive via v2 includes an end v2b embedded within the passivation layer p1. The end v2b of the conductive via v2 is in contact with the thermal conductive structure 10a. The conductive via v2 lands on the thermal conductive structure 10a through the end v2b.

The thermal conductive structure 10a and all the conductive vias embedded within the substrate s1 can be collectively referred to as heat dissipation structure 20.

The wafer DW1 can be referred to as a device wafer. The wafer DW1 includes a substrate s2, a dielectric layer d1, and a passivation layer p2. The wafer DW1 includes seal rings r1, r2, r3, r4, r5, and r6 embedded within the dielectric layer d1. The seal rings r1 and r2 can be disposed on the same elevation. The seal rings r3 and r4 can be disposed on the same elevation. The seal rings r5 and r6 can be disposed on the same elevation. The seal ring r3 is disposed further away from the thermal conductive structure 10a than the seal ring r1. The seal ring r5 is disposed further from the thermal conductive structure 10a than the seal ring r3. The seal ring r4 is disposed further from the thermal conductive structure 10a than the seal ring r2. The seal ring r6 is disposed further from the thermal conductive structure than the seal ring r4.

The seal ring r1 can connect with the seal ring r3. The seal ring r2 can connect with the seal ring r4. The seal ring r3 can connect with the seal ring r5. The seal ring r4 can connect with the seal ring r6.

For example, the seal ring r1 can connect with the seal ring r3 through a connecting structure c5. The seal ring r2 can connect with the seal ring r4 through a connecting structure c6. The seal ring r3 can connect with the seal ring r5 through a connecting structure therebetween. The seal ring r4 can connect with the seal ring r6 through a connecting structure therebetween. In some embodiments, the connecting structure c5 and the connecting structure c3 can be coaxial. In some embodiments, the connecting structure c6 and the connecting structure c4 can be coaxial.

The seal rings r1, r3, and r5 can electrically connect through the connecting structures therebetween. The seal rings r1, r3, and r5 can thermally connect through the connecting structures therebetween. The seal rings r2, r4, and r6 can electrically connect through the connecting structures therebetween. The seal rings r2, r4, and r6 can thermally connect through the connecting structures therebetween.

The seal rings r1, r3, and r5 can electrically connect to the thermal conductive structure 10a through the connecting structures c1 and c3. The seal rings r1, r3, and r5 can thermally connect to the thermal conductive structure 10a through the connecting structures c1 and c3. The connecting structures c1 and c3 can be collectively referred to as a connecting structure.

The seal rings r2, r4, and r6 can electrically connect to the thermal conductive structure 10a through the connecting structures c2 and c4. The seal rings r2, r4, and r6 can thermally connect to the thermal conductive structure 10a through the connecting structures c2 and c4. The connecting structures c2 and c4 can be collectively referred to as a connecting structure.

In some embodiments, the connecting structure c1 and the conductive via v1 can be coaxial. In some embodiments, the connecting structure c3 and the conductive via v1 can be coaxial. In some embodiments, the connecting structure c2 and the conductive via v2 can be coaxial. In some embodiments, the connecting structure c4 and the conductive via v2 can be coaxial.

The wafer DW1 includes a circuit region A1 embedded within the dielectric layer d1. The circuit region A1 can include active components, passive components, wirings, and/or interconnections. The circuit region A1 can include a multilayered structure. The circuit region A1 can be surrounded by the seal rings r1, r2, r3, r4, r5, and r6. The seal rings r1, r2, r3, r4, r5, and r6 can prevent stress from propagating into the semiconductor components within the circuit region A1.

The wafer DW1 includes conductive vias v4 and v5 embedded within the substrate s2. The conductive vias v4 and v5 can penetrate the substrate s2. The conductive vias v4 and v5 can each be referred to as a through silicon via (TSV). The conductive vias v4 and v5 can each include an end embedded within the dielectric layer d1 and another end embedded within the passivation layer p2.

The wafer DW2 can be referred to as a device wafer. The wafer DW2 includes a substrate s3, a dielectric layer d2, and passivation layers p3, p4, and p5.

The wafer DW2 includes seal rings r7, r8, 19, r10, r11, and r12 embedded within the dielectric layer d2. The seal rings r7 and r8 can be disposed on the same elevation. The seal rings r9 and r10 can be disposed on the same elevation. The seal rings r11 and r12 can be disposed on the same elevation.

The seal rings r7, r9, and r11 can electrically connect through the connecting structures therebetween. The seal rings r7, r9, and r11 can thermally connect through the connecting structures therebetween. The seal rings r8, r10, and r12 can electrically connect through the connecting structures therebetween. The seal rings r8, r10, and r12 can thermally connect through the connecting structures therebetween.

The seal rings of the device wafer DW2 can be connected to the seal rings of the device wafer DW1. The seal rings of the device wafer DW2 can thermally connect with the seal rings of the device wafer DW1. For example, the seal rings r7, r9, and r11 can be connected to the seal rings r1, r3, and r5 through the conductive via v4 and the connecting structure c7.

The seal rings of the device wafer DW2 can thermally connect to the thermal conductive structure 10a, for example, through the conductive vias embedded within the substrate s2, the seal rings of the device wafer DW1, and the connecting structures within the dielectric layer d1 and the passivation layer p1.

The wafer DW2 includes a circuit region A2 embedded within the dielectric layer d2. The circuit region A2 can include active components, passive components, wirings, and/or interconnections. The circuit region A2 can include a multilayered structure. The circuit region A2 can be surrounded by the seal rings r7, r8, r9, r10, r11, and r12. The seal rings r7, r8, r9, r10, r11, and r12 can prevent stress from propagating into the semiconductor components within the circuit region A2.

The semiconductor components within the circuit region A2 can electrically connect with those within the circuit region A2, through the conductive via v5 embedded within the substrate s2.

The wafer DW2 includes conductive vias v6 and v7 embedded within the substrate s3. The conductive vias v6 and v7 can penetrate the substrate s3. The conductive vias v6 and v7 can each be referred to as a through silicon via (TSV). The conductive vias v6 and v7 can each include an end embedded within the dielectric layer d2 and another end embedded within the passivation layer p4.

The wafer DW2 further includes a plurality of conductive bumps b1 partially embedded within the passivation layer p5. Some of the conductive bumps b1 can be configured to transmit/receive signals to/from the circuit regions A1 and/or A2. Some of the conductive bumps b1 can be part of the signal transmission paths of the semiconductor structure 200. Some of the conductive bumps b1 can be part of the thermal conductive paths of the semiconductor structure 200.

Figure 3A:
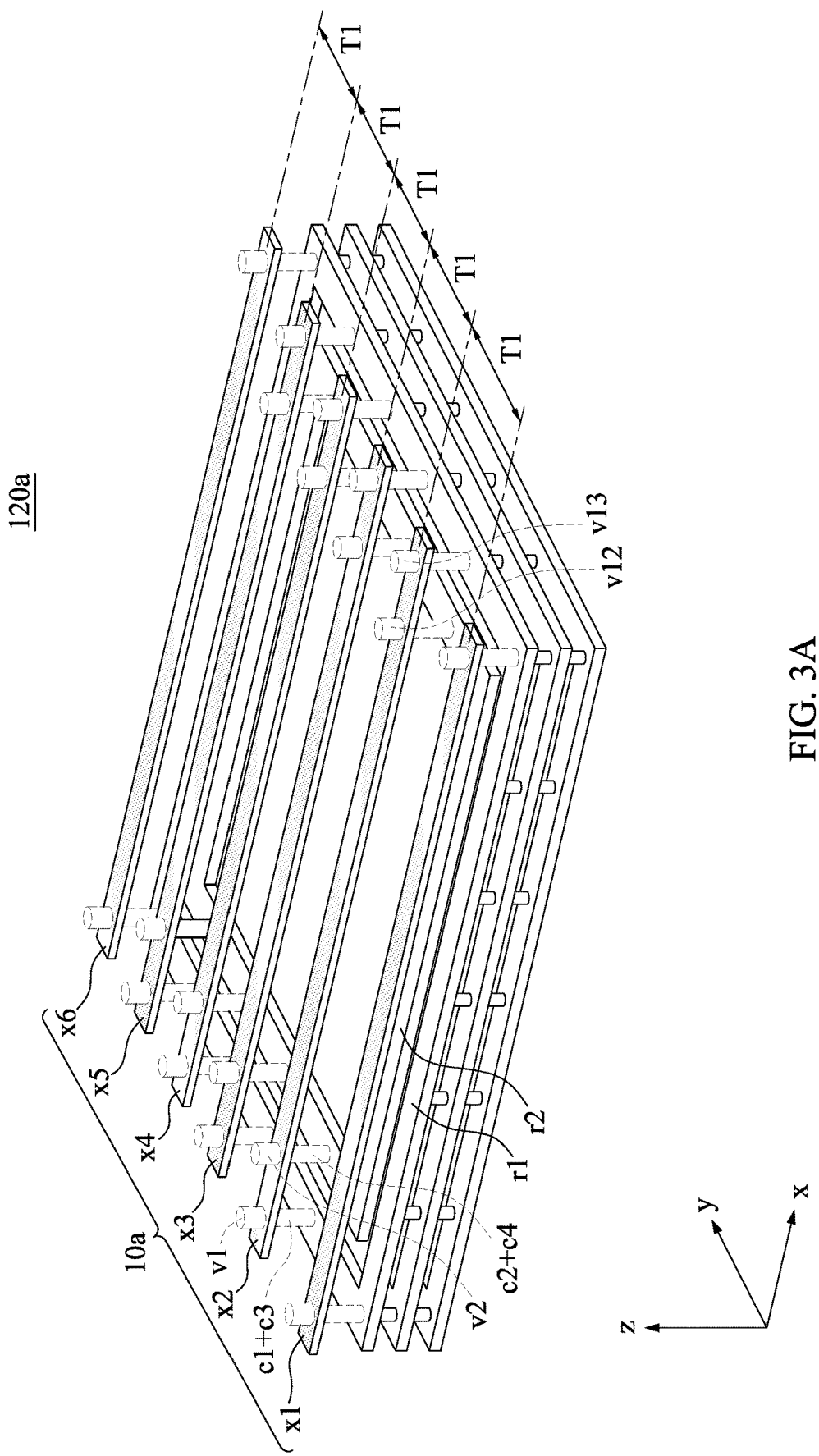
FIG. 3A is a schematic view of a semiconductor structure, in accordance with some embodiments of the present disclosure.

FIG. 3A is a schematic view of a semiconductor structure, in accordance with some embodiments of the present disclosure. FIG. 3A shows a semiconductor structure 120a. The semiconductor structure 120a can be a portion of a 3D stacked chip package or a wafer-on-wafer structure. The semiconductor structure 120a can be a heat dissipation structure for a 3D stacked chip package or a wafer-on-wafer structure. The semiconductor structure 120a includes a thermal conductive structure 10a, conductive vias v1, v2, v12, and v13, seal rings r1 and r2, and connecting structures c1, c2, c3, and c4.

The thermal conductive structure 10a includes ribs x1, x2, x3, x4, x5, and x6 extending in an X direction. The ribs x1, x2, x3, x4, x5, and x6 can be spaced apart from each other by a constant distance T1. In some embodiments, the distance between each of the ribs x1, x2, x3, x4, x5, and x6 can be adjusted in accordance with design needs. The ribs of the conductive structure 10a facilitate a relatively uniform heat transmission and thus the efficiency of heat dissipation can be enhanced. The ribs also enhance the structural stability of the thermal conductive structure 10a.

Referring to FIG. 3A, the conductive vias v1, v2, v12, and v13 land on the rib x2 and extend in a Z direction. Although a specific number (i.e., 4) of conductive vias are shown in this embodiment to land on a single rib, it can be contemplated that the number of conductive vias on a single rib can be adjusted in accordance with design needs. In some embodiments, a single rib of the thermal conductive structure 10 a can include more than four conductive vias mounted thereon. In some embodiments, a single rib of the thermal conductive structure 10 a can include fewer than four conductive vias mounted thereon.

The seal rings r1 and r2 can be connected through the thermal conductive structure 10a. For example, the seal rings r1 and r2 can connect with the thermal conductive structure 10a through the rib x2 and the connecting structures c1, c2, c3, and c4. In some embodiments, each rib of the thermal conductive structure 10a can connect with the seal rings r1 and r2. In other embodiments, only some ribs of the thermal conductive structure 10a are connected with the seal rings r1 and r2.

The thermal conductive structure 10a, all the conductive vias, all the seal rings, and all the connecting structures shown in the FIG. 3A can collectively function as a heat dissipation structure.

Figure 3B:
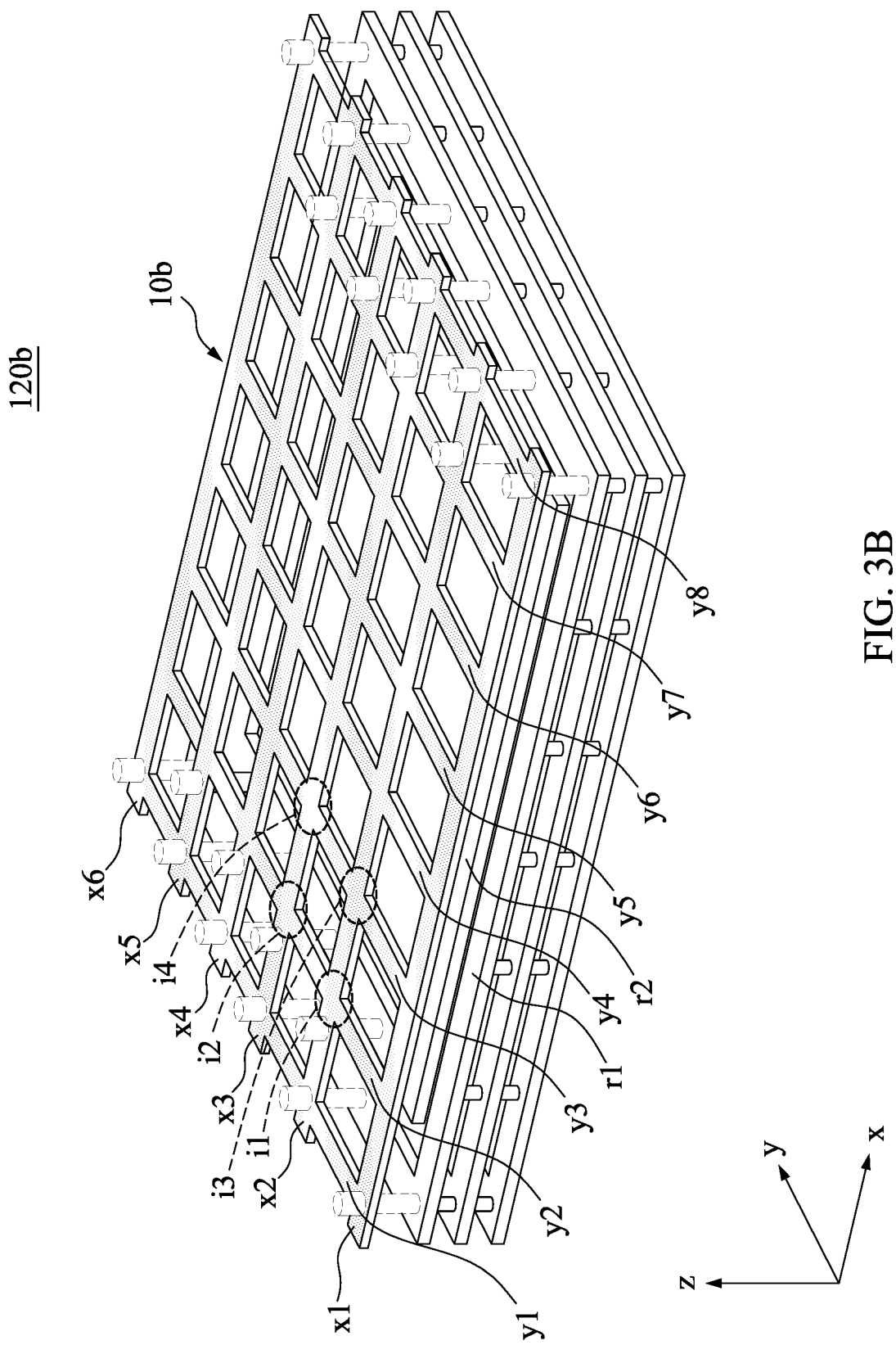
FIG. 3B is a schematic view of a semiconductor structure, in accordance with some embodiments of the present disclosure.

FIG. 3B is a schematic view of a semiconductor structure, in accordance with some embodiments of the present disclosure.

FIG. 3B shows a semiconductor structure 120b. The semiconductor structure 120b can be a portion of a 3D stacked chip package or a wafer-on-wafer structure. The semiconductor structure 120b can be a heat dissipation structure for a 3D stacked chip package or a wafer-on-wafer structure. The semiconductor structure 120b includes a thermal conductive structure 10b, a plurality of conductive vias land on the thermal conductive structure 10b, seal rings r1 and r2, and several connecting structures disposed between the thermal conductive structure 10b and the seal rings r1 or r2.

The thermal conductive structure 10b includes ribs x1, x2, x3, x4, x5, and x6 extending in an X direction. The ribs x1, x2, x3, x4, x5, and x6 can be spaced apart from each other by a constant distance. In some embodiments, the distance between each of the ribs x1, x2, x3, x4, x5, and x6 can be adjusted in accordance with design needs. Although a specific number (i.e., 6) of ribs are shown in this embodiment to extend along an X direction, it can be contemplated that the number of ribs extending in an X direction can be adjusted in accordance with design needs.

The thermal conductive structure 10b includes ribs y1, y2, y3, y4, y5, y6, y7, and y8 extending in a Y direction. The ribs y1, y2, y3, y4, y5, y6, y7, and y8 can be spaced apart from each other by a constant distance. In some embodiments, the distance between each of the ribs y1, y2, y3, y4, y5, y6, y7, and y8 can be adjusted in accordance with design needs. Although a specific number (i.e., 8) of ribs are shown in this embodiment to extend in a Y direction, it can be contemplated that the number of ribs extending in a Y direction can be adjusted in accordance with design needs.

The ribs x1, x2, x3, x4, x5, and x6 and the ribs y1, y2, y3, y4, y5, y6, y7, and y8 collectively form a mesh structure. The thermal conductive structure 10b includes a mesh profile. The mesh profile of the conductive structure 10b facilitates a relatively uniform heat transmission and thus the efficiency of heat dissipation can be enhanced. The mesh profile can also enhance the structural stability of the thermal conductive structure 10b.

The thermal conductive structure 10b includes a plurality of intersections. For example, the rib y2 intersects with the rib x2 at the intersection i1, the rib y2 intersects with the rib x3 at the intersection i2, the rib y3 intersects with the rib x2 at the intersection i3, and the rib y3 intersects with the rib x3 at the intersection i4.

Figure 3C:
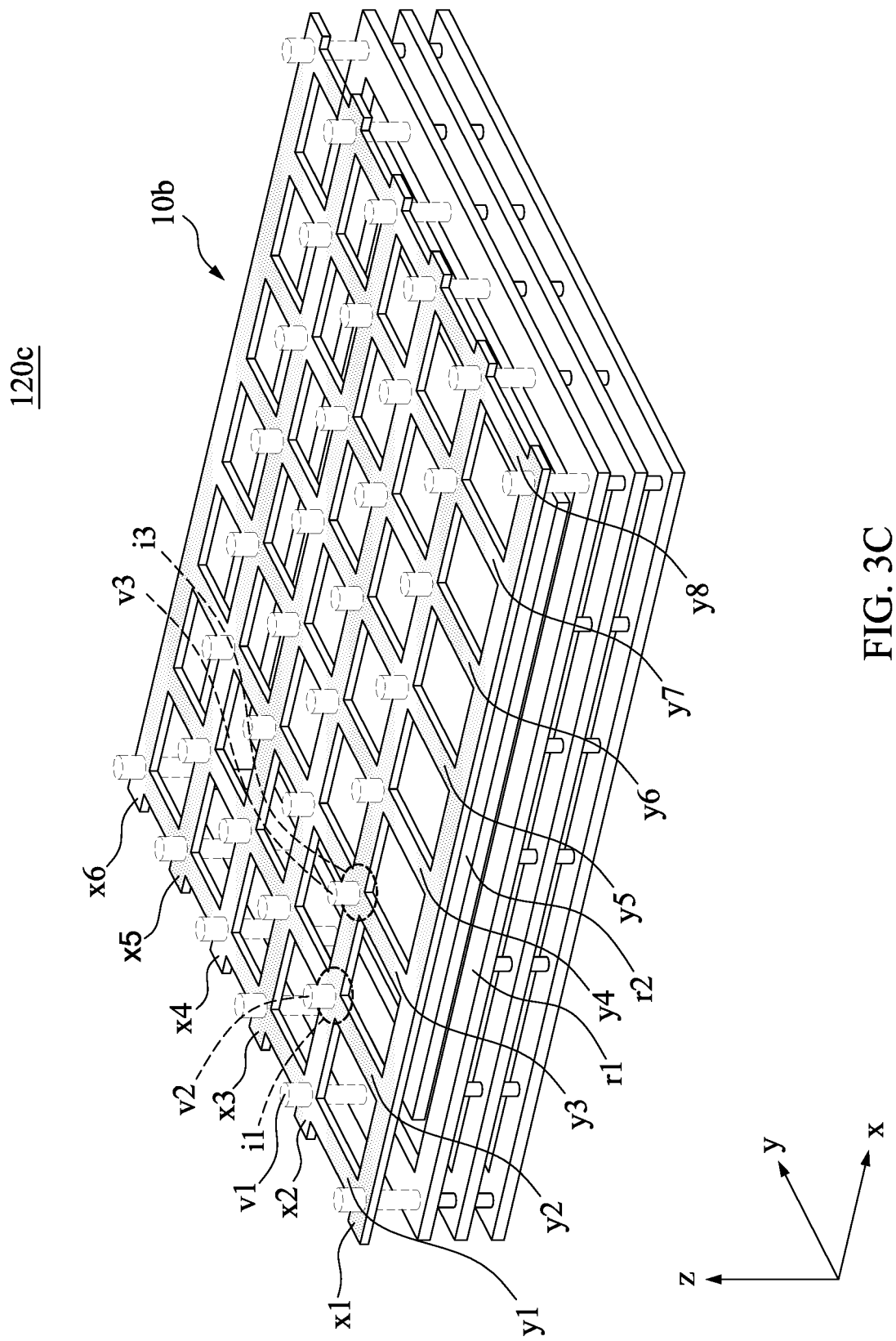
FIG. 3C is a schematic view of a semiconductor structure, in accordance with some embodiments of the present disclosure.

FIG. 3C is a schematic view of a semiconductor structure, in accordance with some embodiments of the present disclosure.

FIG. 3C shows a semiconductor structure 120c. The semiconductor structure 120c can be a portion of a 3D stacked chip package or a wafer-on-wafer structure. The semiconductor structure 120c can be a heat dissipation structure for a 3D stacked chip package or a wafer-on-wafer structure. The semiconductor structure 120c includes a thermal conductive structure 10b, a plurality of conductive vias (e.g., v2 and v3) land on the thermal conductive structure 10b, seal rings r1 and r2, and several connecting structures disposed between the thermal conductive structure 10b and the seal rings r1 or r2.

The semiconductor structure 120c includes a plurality of conductive vias disposed on the intersections of the thermal conductive structure 10b. For example, the semiconductor structure 120c can include a conductive via v2 located on the intersection i1, and a conductive via v3 located on the intersection i3. In this embodiment, all the conductive vias are located on the intersections of the thermal conductive structure 10b. Nevertheless, it can be contemplated that the locations of the conductive vias on the thermal conductive structure 10b can be adjusted in accordance with design needs. That is, the thermal conductive structure 10b may include one or more conductive vias disposed on locations other than the intersections.

Figure 4:
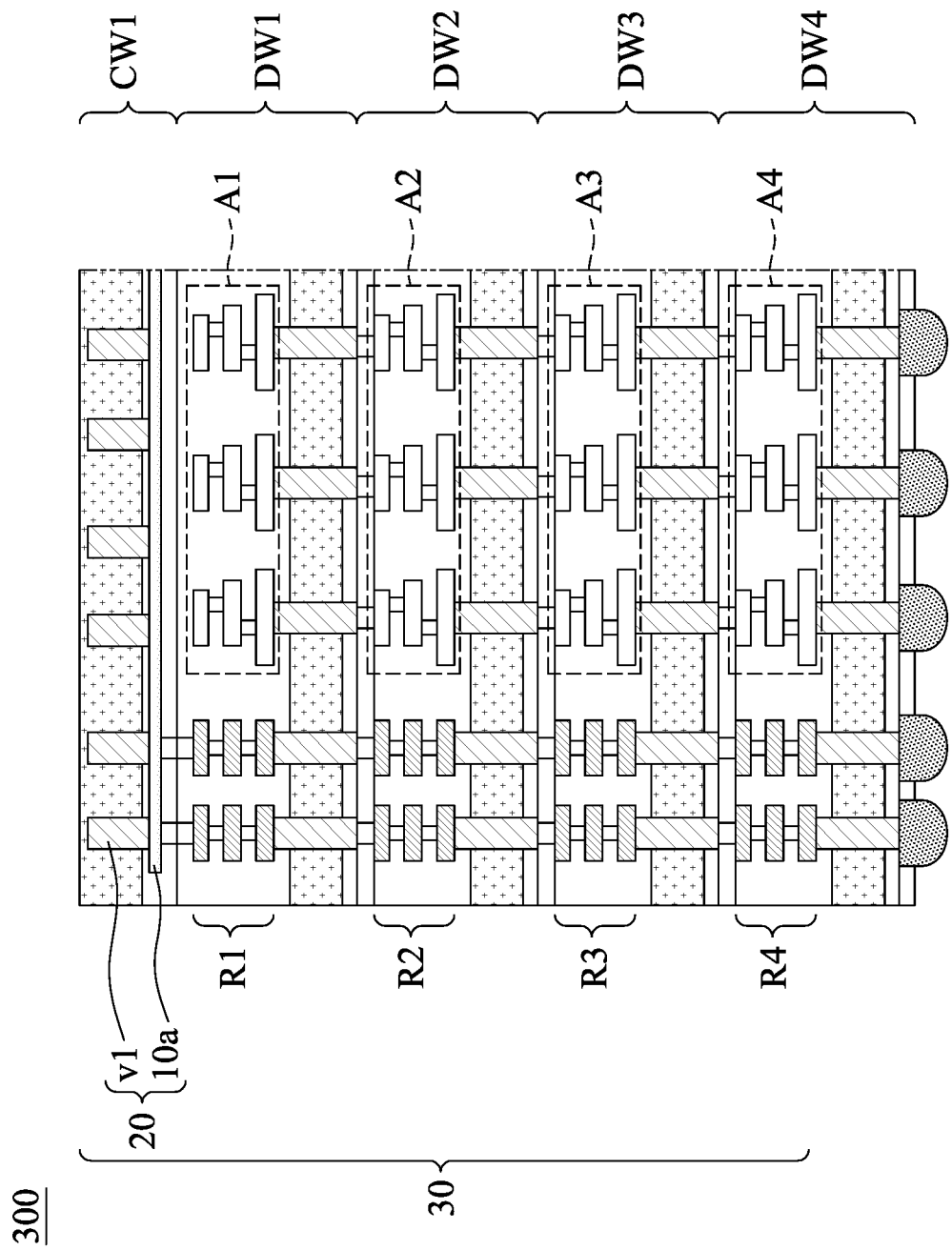
FIG. 4 is a cross section of a semiconductor structure, in accordance with some embodiments of the present disclosure.

FIG. 4 is a cross section view of a semiconductor structure, in accordance with some embodiments of the present disclosure. FIG. 4 shows a semiconductor structure 300. The semiconductor structure 300 can correspond to a cross section of a 3D stacked chip package or a wafer-on-wafer structure. The semiconductor structure 300 includes vertically-stacked wafers CW1, DW1, DW2, DW3, and DW4.

The wafer CW1 can be referred to as a carrier wafer. The wafer CW1 includes a plurality of through silicon vias (TSVs) and a thermal conductive structure 10a. The TSVs (e.g., the conductive via v1) and the thermal conductive structure 10a can be collectively referred to as a heat dissipation structure 20.

The wafer DW1 can be referred to as a device wafer. The wafer DW1 includes a circuit region A1 surrounded by a seal ring structure R1. The wafer DW1 can be bonded to the wafer CW1 using hybrid bonding. The wafer DW2 can be referred to as a device wafer. The wafer DW2 includes a circuit region A2 surrounded by a seal ring structure R2. The wafer DW2 can be bonded to the wafer DW1 using hybrid bonding. The wafer DW2 can be bonded to the wafer DW1 in a "face-to-back" manner. The wafer DW3 can be referred to as a device wafer. The wafer DW3 includes a circuit region A3 surrounded by a seal ring structure R3. The wafer DW3 can be bonded to the wafer DW2 using hybrid bonding. The wafer DW3 can be bonded to the wafer DW2 in a "face-to-back" manner. The wafer DW4 can be referred to as a device wafer. The wafer DW4 includes a circuit region A4 surrounded by a seal ring structure R4. The wafer DW4 can be bonded to the wafer DW3 using hybrid bonding. The wafer DW4 can be bonded to the wafer DW3 in a "face-to-back" manner.

The heat dissipation structure 20 and the seal ring structures R1, R2, R3, and R4 can collectively form a 3D heat dissipation structure 30. The 3D heat dissipation structure 30 can facilitate dissipation of generated heat from the wafers DW1, DW2, DW3, and DW4. The 3D heat dissipation structure 30 can facilitate dissipation of generated heat from circuit regions A1, A2, A3, and A4 of the wafers DW1, DW2, DW3, and DW4.

FIG. 5A, FIG. 5B, FIG. 5C, FIG. 5D, FIG. 5E, FIG. 5F, FIG. FIG. 5H, FIG. 5I, FIG. 5J, FIG. 5K, FIG. 5L, FIG. 5M, FIG. 5N, FIG. 5O, FIG. 5P, FIG. 5Q, FIG. 5R, FIG. 5S, and FIG. 5T illustrate various stages of a method of manufacturing a semiconductor structure 200, in accordance with some embodiments of the present disclosure.

Figure 5A:
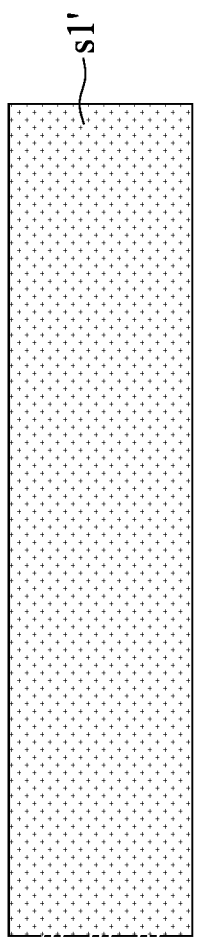
FIG. 5A illustrates one stage of a method of manufacturing a semiconductor structure, in accordance with some embodiments of the present disclosure.

Referring to FIG. 5A, a substrate s1' is provided. In some embodiments, the substrate s1' can include single crystal substrates, semiconductor on insulator (SOI) substrates, doped silicon bulk substrate, and epitaxial film on semiconductor (EPI) substrates and the like. Further, although the various embodiments can be primarily described with respect to materials and processes compatible with silicon-based semiconductor materials (e.g., silicon and alloys of silicon with germanium and/or carbon), the present disclosure is not limited in this regard. Rather, the various embodiments can be implemented using any types of semiconductor materials.

Figure 5B:
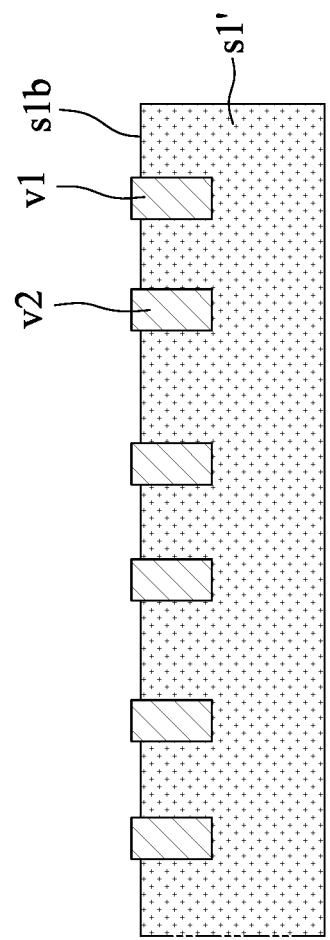
FIG. 5B illustrates one stage of a method of manufacturing a semiconductor structure, in accordance with some embodiments of the present disclosure.

Referring to FIG. 5B, a plurality of TSVs (e.g., the conductive vias v1 and v2) is formed. A portion of each of the TSVs extends into the substrate s1' and stays embedded within the substrate s1'. An end of each of the TSVs is exposed by the substrate s1'. In some embodiments, an end of each of the TSVs protrudes from a surface s1b of the substrate s1'. In some embodiments, each of the TSVs includes an end that is not coplanar with the surface s1b of the substrate s1'. In some embodiments, both ends of each of the TSVs are not coplanar with the surface s1b of the substrate s1'.

The formations of the plurality of TSVs may involve forming trenches on the substrate s1' by dry etching. In the present disclosure, dry etching refers to the removal of material by exposing the material to a bombardment of ions that dislodge portions of the material from the exposed surface. In some embodiments, the mentioned ions may include, but are not limited to, fluorocarbons, oxygen, chlorine, or boron trichloride. In some embodiments, addition of nitrogen, argon, helium and other gases may also be involved in the dry etching process.

Figure 5C:
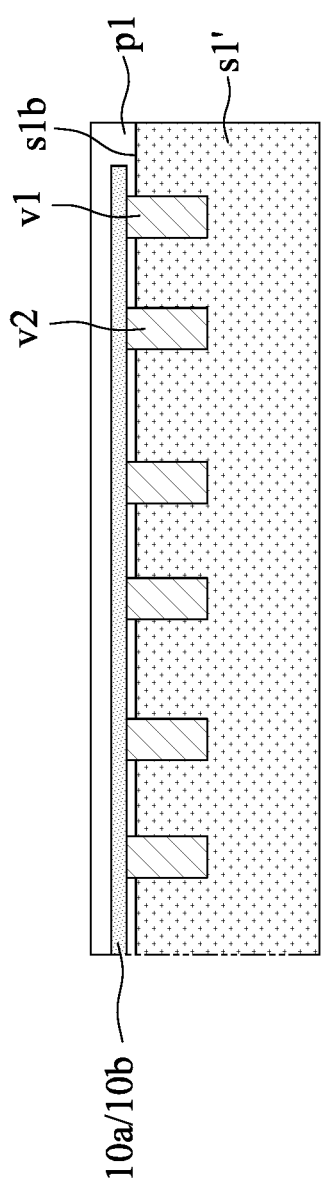
FIG. 5C illustrates one stage of a method of manufacturing a semiconductor structure, in accordance with some embodiments of the present disclosure.

Referring to FIG. 5C, a passivation layer p1 with a thermal conductive structure 10a or 10b embedded therein can be formed on the substrate s1'. The passivation layer p1 may be of one or more suitable dielectric materials such as silicon oxide, silicon nitride, low-k dielectrics such as carbon doped oxides, extremely low-k dielectrics such as porous carbon doped silicon dioxide, combinations thereof, or the like. The passivation layer p1 may be formed through a process such as chemical vapor deposition (CVD), although any suitable process may be utilized, and may have a thickness between about 0.5 µm and about 5 µm, such as about 9.25 kÅ.

The thermal conductive structures 10a or 10b are in contact with the plurality of TSVs (e.g., the conductive vias v1 and v2). The thermal conductive structures 10a or 10b thermally connected with the plurality of TSVs of the substrate s1'. In some embodiments, the thermal conductive structure 10a or 10b can include a plurality of ribs or strips. In some embodiments, the thermal conductive structure 10a or 10b can include a mesh structure.

Figure 5D:
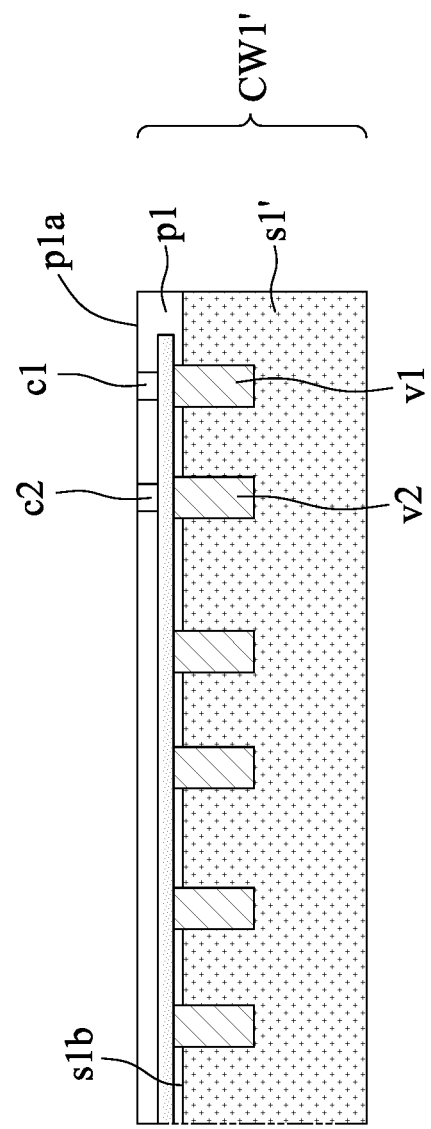
FIG. 5D illustrates one stage of a method of manufacturing a semiconductor structure, in accordance with some embodiments of the present disclosure.

Referring to FIG. 5D, one or more connecting structures (e.g., connecting structures c1 and c2) are formed in contact with the thermal conductive structure 10a or 10b. In some embodiments, the connecting structures are embedded within the passivation layer p1. One end of the connecting structures c1 and c2 can be exposed by a surface p1a of the passivation layer p1. In some embodiments, the connecting structure c1 and the conductive via v1 can be coaxial. In some embodiments, the connecting structure c2 and the conductive via v2 can be coaxial. The semiconductor structure formed in the operation of FIG. 5D can be referred to as a wafer CW1'.

Referring to FIG. 5E, a wafer including a substrate s2' and a dielectric layer d1 disposed thereon is provided. The dielectric layer d1 includes a circuit region A1 embedded therein and a seal ring structure R1 surrounding the circuit region A1. The dielectric layer d1 may include silicon oxide layers, silicon nitride layers, silicon oxy-nitride layers, or dielectric layers formed by other suitable dielectric materials, and the dielectric layer d1 may be formed by deposition or the like. In some embodiments, the dielectric layer d1 may include a multilayered structure.

Referring to FIG. 5F, connecting structures c3 and c4 are formed in contact with the seal ring structure R1. The connecting structures c3 and c4 are thermally connected to the seal ring structure R1. One end of each of the connecting structures c3 and c4 is exposed by the dielectric layer d1. The semiconductor structure obtained in the operation of FIG. 5F can be referred to as a wafer DW1'.

Figure 5G:
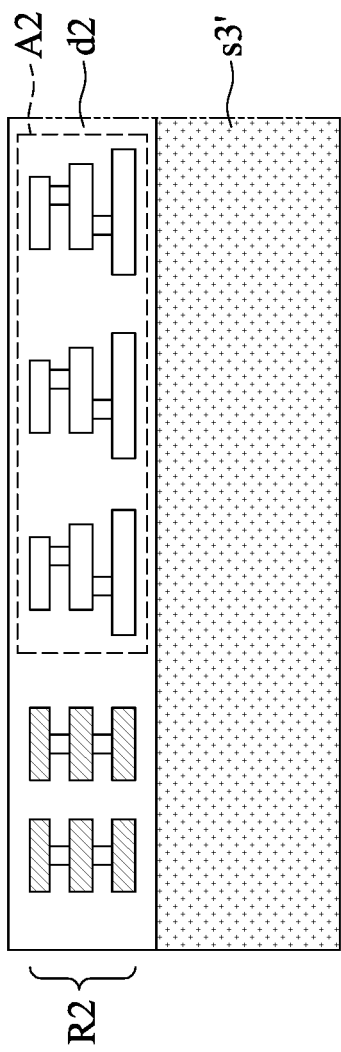
FIG. 5G illustrates one stage of a method of manufacturing a semiconductor structure, in accordance with some embodiments of the present disclosure.

Referring to FIG. 5G, a wafer including a substrate s3' and a dielectric layer d2 disposed thereon is provided. The dielectric layer d2 includes a circuit region A2 embedded therein and a seal ring structure R2 surrounding the circuit region A2. The dielectric layer d2 may include silicon oxide layers, silicon nitride layers, silicon oxy-nitride layers, or dielectric layers formed by other suitable dielectric materials, and the dielectric layer d2 may be formed by deposition or the like. In some embodiments, the dielectric layer d2 may include a multilayered structure.

Figure 5H:
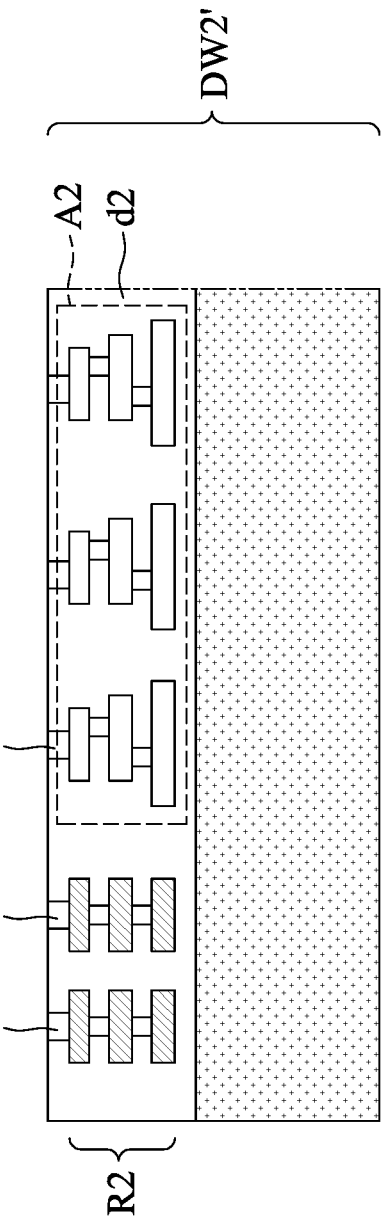
FIG. 5H illustrates one stage of a method of manufacturing a semiconductor structure, in accordance with some embodiments of the present disclosure.

Referring to FIG. 5H, connecting structures c7 and c8 are formed in contact with the seal ring structure R2. The connecting structures c7 and c8 are thermally connected to the seal ring structure R2. One end of each of the connecting structures c7 and c8 is exposed by the dielectric layer d2. In addition, connecting structures c9 are formed in contact with at least one layer of the circuit region A2. The semiconductor structure obtained in the operation of FIG. 5H can be referred to as a wafer DW2'.

Figure 5I:
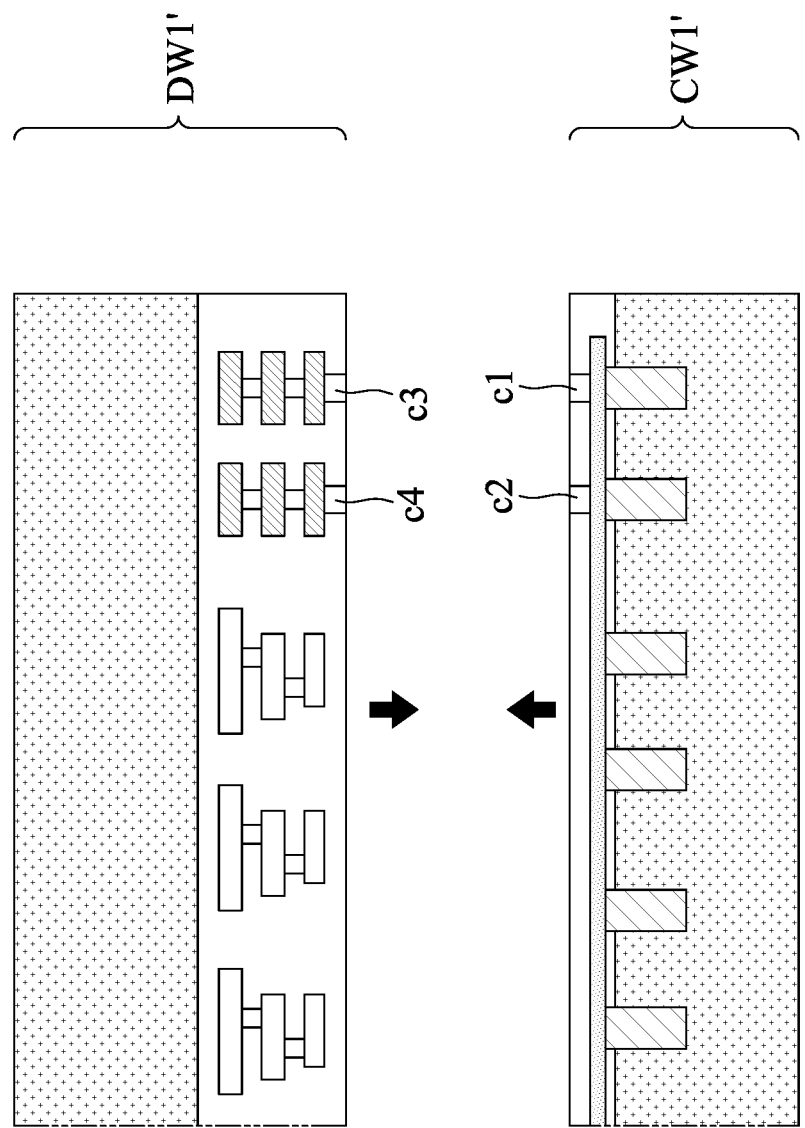
FIG. 5I illustrates one stage of a method of manufacturing a semiconductor structure, in accordance with some embodiments of the present disclosure.

Referring to FIG. 5I, the wafer DW1' and the wafer CW1' are bonded. The connecting structures c1 and c3 are in contact and the connecting structures c2 and c4 are in contact. The wafer DW1' can be bonded to the wafer CW1' using hybrid bonding. Hybrid bonding can use adhesives, such as polyimides, thermocompression, diffusion bonding, pressure joining, and the like, to create metal-to-metal, insulator-to-insulator, and metal-to-insulator bonding to achieve vertically stacked wafers. The wafers DW1' and CW1' can be bonded in a "face-to-face" manner.

Figure 5J:
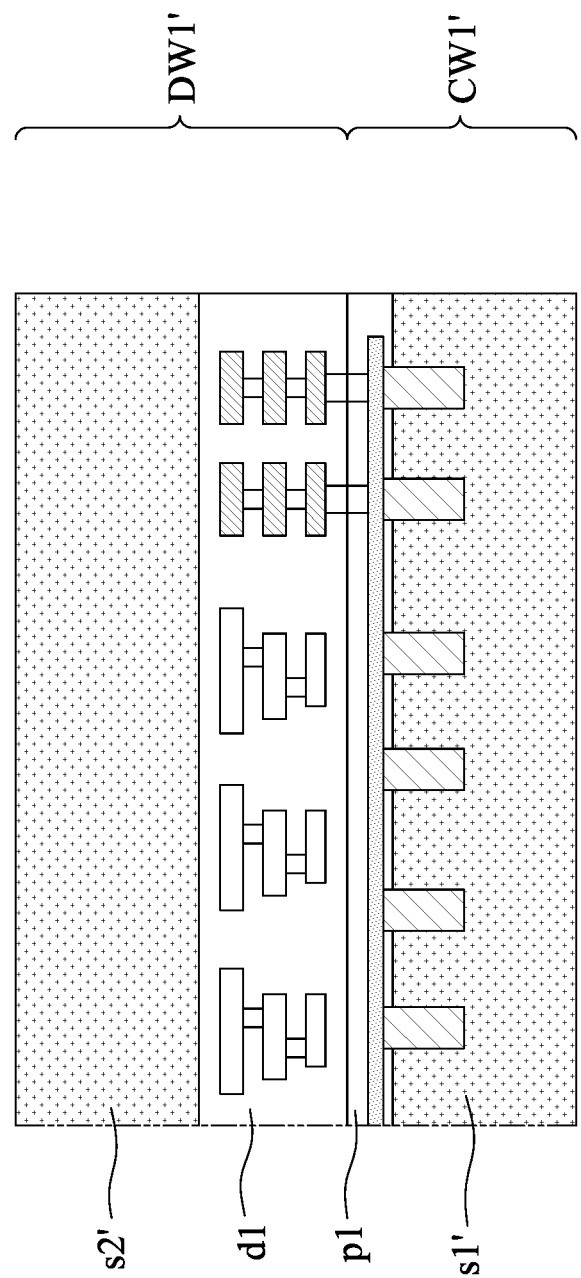
FIG. 5J illustrates one stage of a method of manufacturing a semiconductor structure, in accordance with some embodiments of the present disclosure.

Referring to FIG. 5J, the semiconductor structure as shown is obtained after the wafer DW1' is bonded to the wafer CW1'. The dielectric layer d1 of the wafer DW1' and the passivation layer p1 of the wafer CW1' are sandwiched by the substrates s1' and s2'.

Figure 5K:
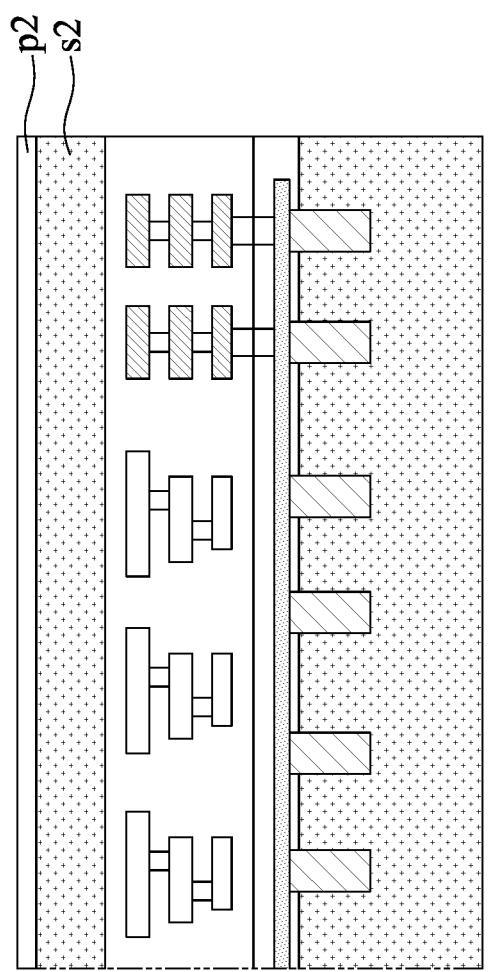
FIG. 5K illustrates one stage of a method of manufacturing a semiconductor structure, in accordance with some embodiments of the present disclosure.

Referring to FIG. 5K, the substrate s2' is thinned to form the substrate s2, and a passivation layer p2 is formed thereon. The substrate s2' can be thinned by mechanical grinding, chemical mechanical polishing (CMP), wet etching, or atmospheric downstream plasma (ADP) dry chemical etching (DCE).

The passivation layer p2 may be of one or more suitable dielectric materials such as silicon oxide, silicon nitride, low-k dielectrics such as carbon doped oxides, extremely low-k dielectrics such as porous carbon doped silicon dioxide, combinations thereof, or the like. The passivation layer p2 may be formed through a process such as chemical vapor deposition (CVD), although any suitable process may be utilized, and may have a thickness between about 0.5 µm and about 5 µm, such as about 9.25 kÅ.

Figure 5L:
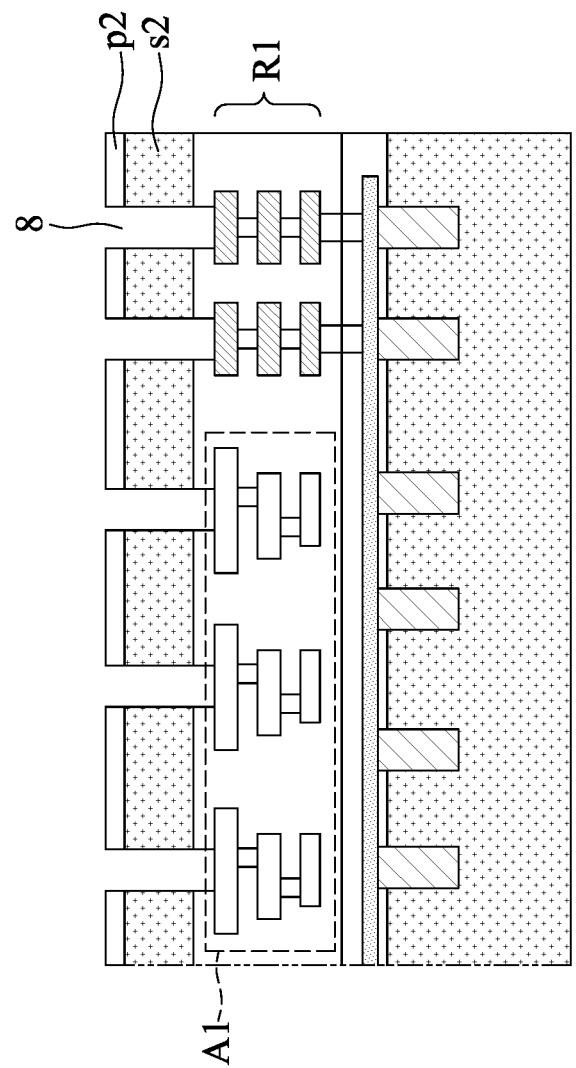
FIG. 5L illustrates one stage of a method of manufacturing a semiconductor structure, in accordance with some embodiments of the present disclosure.

Referring to FIG. 5L, a plurality of trenches 8 penetrating the passivation layer p2 and the substrate s2 are formed. The plurality of trenches 8 can each be referred to as a hole, a cavity, or a pit. The plurality of trenches 8 can be formed by, for example, dry etching. The trenches 8 can be formed by dry etching until at least a portion of the seal ring R1 is exposed. The trenches 8 can be formed by dry etching until at least a portion of the circuit region A1 is exposed.

Figure 5M:
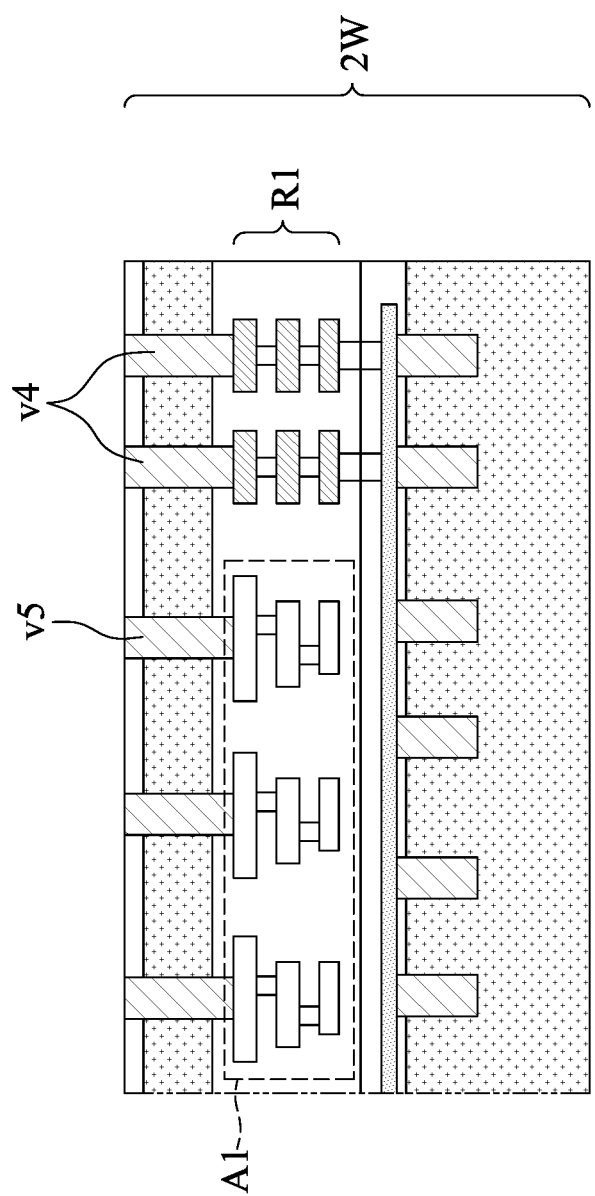
FIG. 5M illustrates one stage of a method of manufacturing a semiconductor structure, in accordance with some embodiments of the present disclosure.

Referring to FIG. 5M, a plurality of TSVs (e.g., the conductive vias v4 and v5) are formed within the trenches 8. Some of the TSVs (e.g., the conductive via v4) are in contact with the seal ring R1. Some of the TSVs (e.g., the conductive via v5) are in contact with at least one layer of the circuit region A1. The semiconductor structure obtained in the operation of FIG. 5M can be referred to as a semiconductor structure 2W.

Figure 5N:
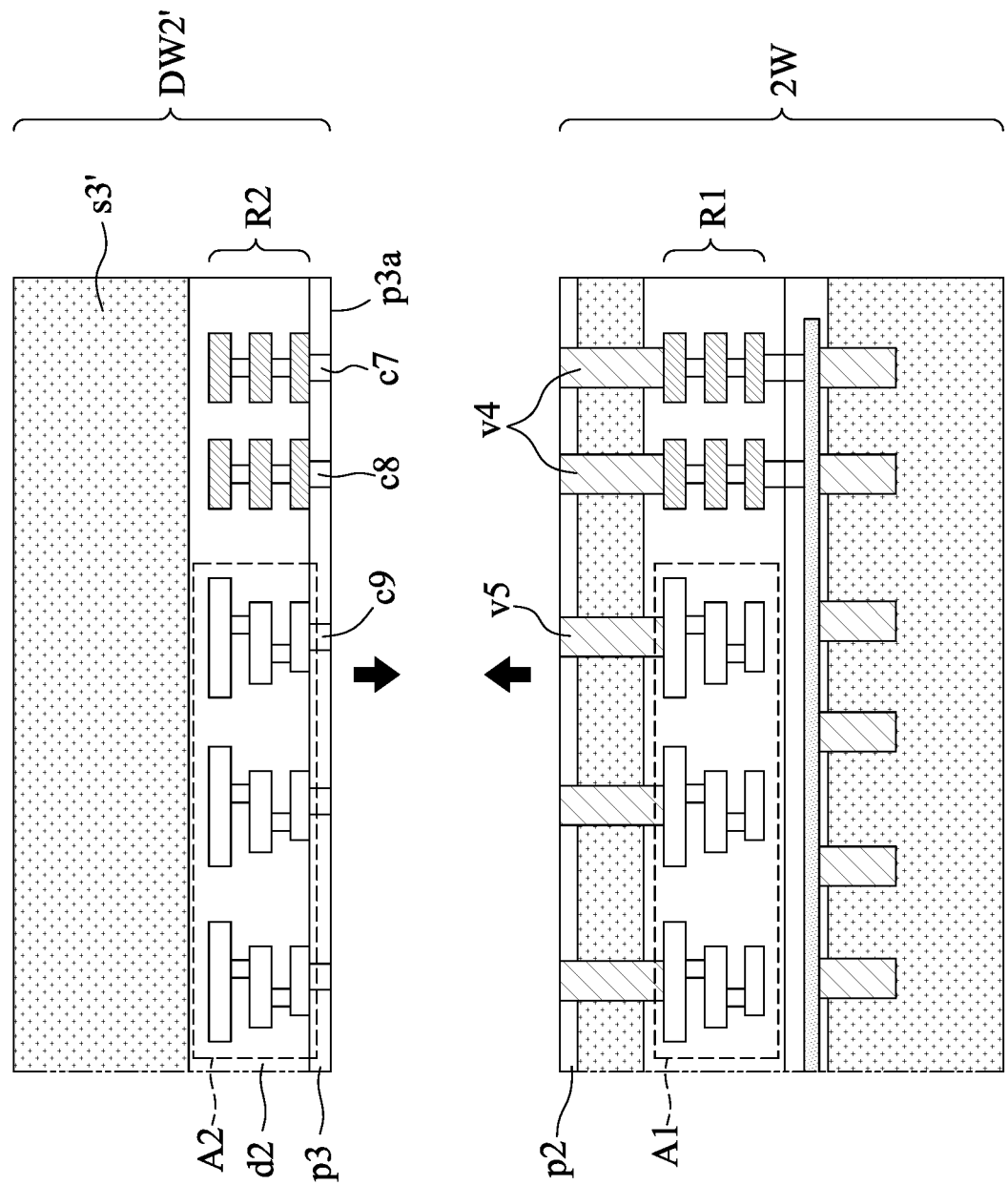
FIG. 5N illustrates one stage of a method of manufacturing a semiconductor structure, in accordance with some embodiments of the present disclosure.

Referring to FIG. 5N, the wafer DW2' and the semiconductor structure 2W are bonded. The connecting structures c7 and c8 are in contact with the conductive vias v4. The connecting structure c9 is in contact with the conductive via v5.

The wafer DW2' can be bonded to the semiconductor structure 2W using hybrid bonding. Hybrid bonding can use adhesives, such as polyimides, thermocompression, diffusion bonding, pressure joining, and the like, to create metal-to-metal, insulator-to-insulator, and metal-to-insulator bonding to achieve vertically stacked wafers. The wafer DW2' and the semiconductor structure 2W can be bonded in a "face-to-back" manner. That is, the "face" of the wafer DW2' is bonded to the "back" of the semiconductor structure 2W.

In the "face-to-back" bonding, the circuit regions A1 and A2 can be located on the same side, and the seal ring structures R1 and R2 can be located on the same side, such that the circuit regions A1 and A2 can be interconnected with short routings (e.g., through the conductive via v5) and that the seal ring structures R1 and R2 can be interconnected with short routings (e.g., through the conductive via v4). In the "face-to-back" bonding, there is no need to prepare a wafer in which the circuit region and the seal ring structure are arranged in a mirrored manner (or flipped manner). As a result, the overall manufacturing process can be simplified and the cost can be reduced.

Figure 5O:
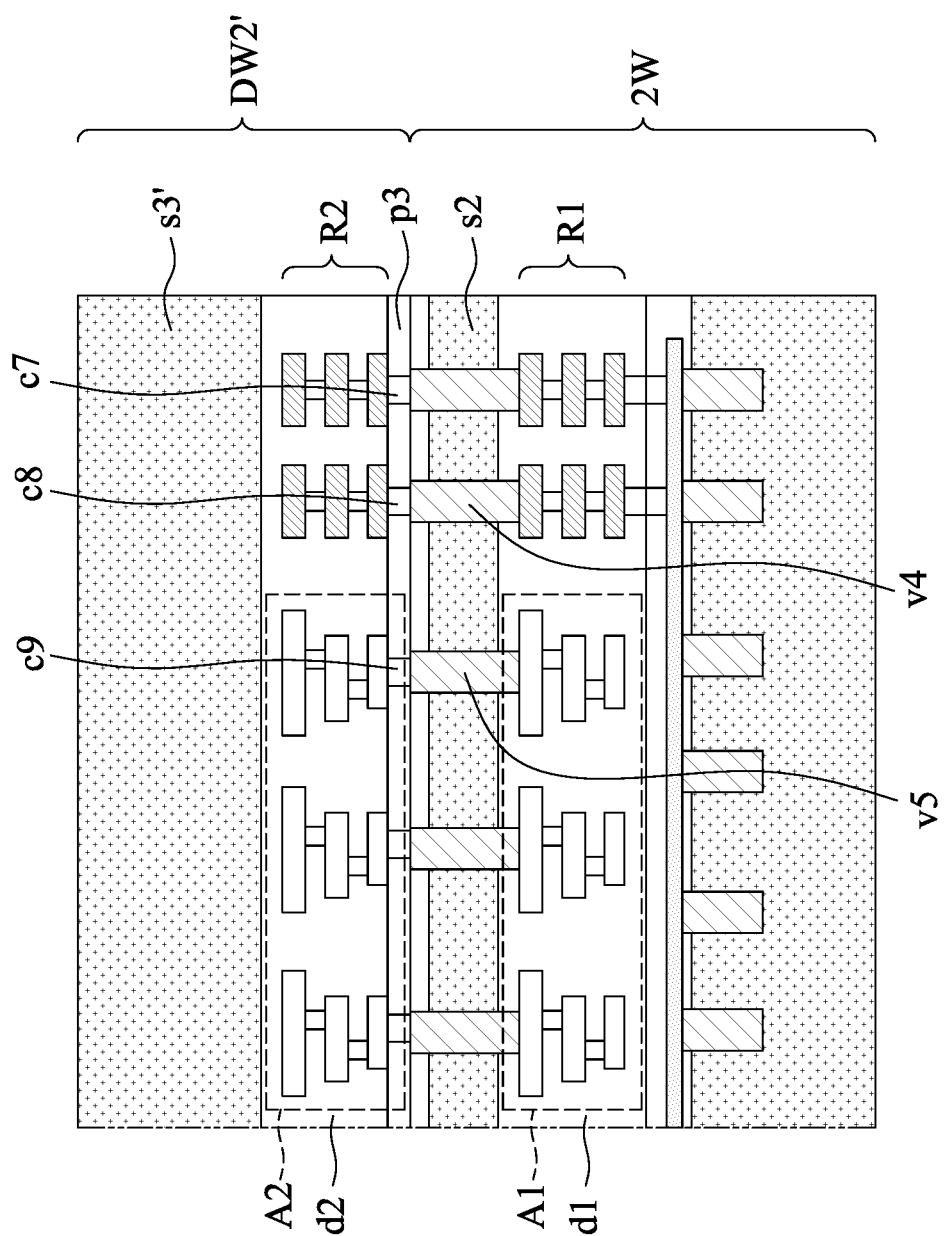
FIG. 5O illustrates one stage of a method of manufacturing a semiconductor structure, in accordance with some embodiments of the present disclosure.

Referring to FIG. 5O, the semiconductor structure as shown is obtained after the wafer DW2' is bonded to the semiconductor structure 2W. The circuit region A1 can electrically connect with the circuit region A2 through the conductive via v5 and the connecting structure c9. The seal ring structure R1 can thermally connect with the seal ring structure R2 through the conductive via v4 and the connecting structures c7 and c8.

Figure 5P:
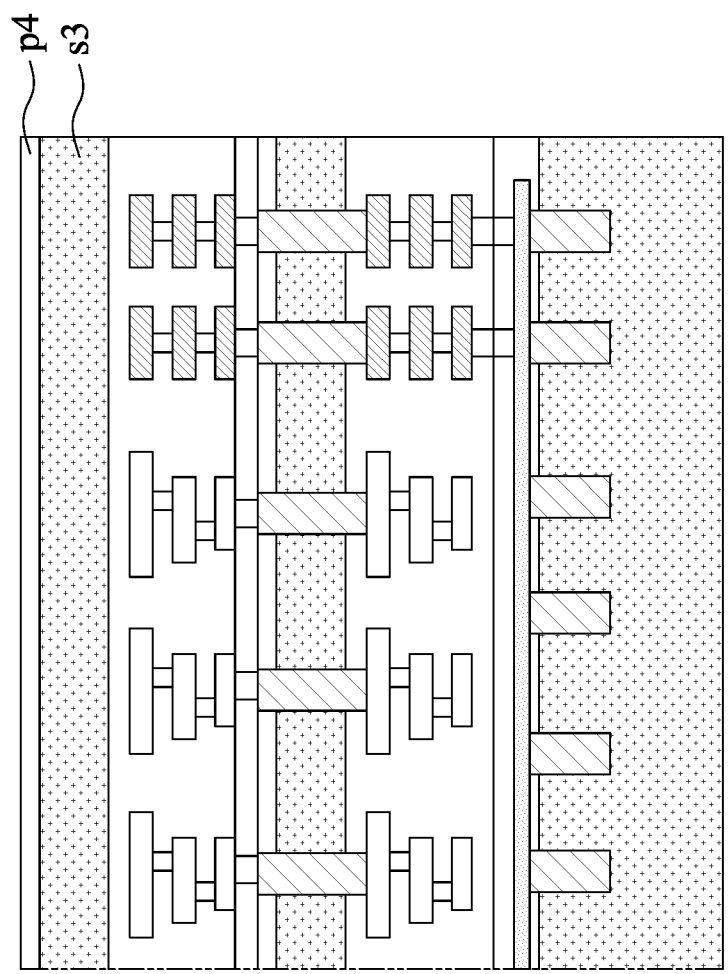
FIG. 5P illustrates one stage of a method of manufacturing a semiconductor structure, in accordance with some embodiments of the present disclosure.

Referring to FIG. 5P, the substrate s3' is thinned to form the substrate s3, and then a passivation layer p4 is formed thereon. The substrate s3' can be thinned by mechanical grinding, chemical mechanical polishing (CMP), wet etching, or atmospheric downstream plasma (ADP) dry chemical etching (DCE). The passivation layer p4 may be of one or more suitable dielectric materials such as silicon oxide, silicon nitride, low-k dielectrics such as carbon doped oxides, extremely low-k dielectrics such as porous carbon doped silicon dioxide, combinations thereof, or the like.

Figure 5Q:
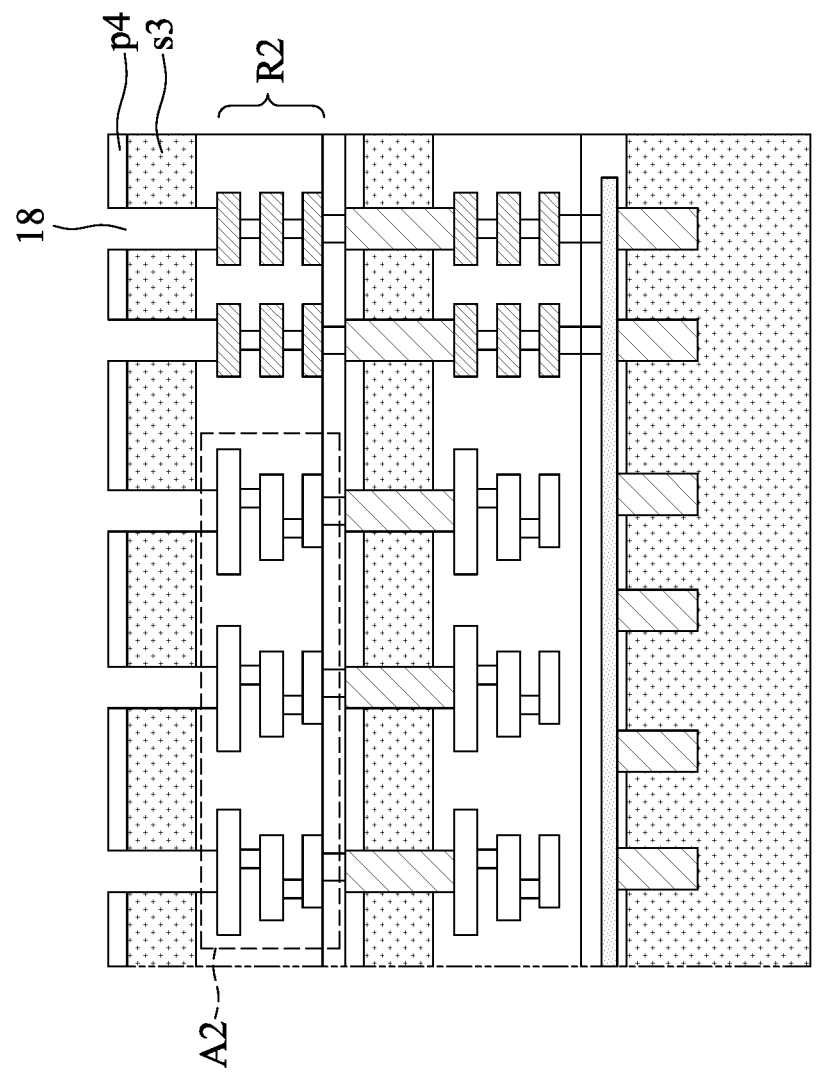
FIG. 5Q illustrates one stage of a method of manufacturing a semiconductor structure, in accordance with some embodiments of the present disclosure.

Referring to FIG. 5Q, a plurality of trenches 18 penetrating the passivation layer p4 and the substrate s3 are formed. The plurality of trenches 18 can each be referred to as a hole, a cavity, or a pit. The plurality of trenches 18 can be formed by, for example, by dry etching. The trenches 18 can be formed by dry etching until at least a portion of the seal ring R2 is exposed. The trenches 18 can be formed by dry etching until at least a portion of the circuit region A2 is exposed.

Figure 5R:
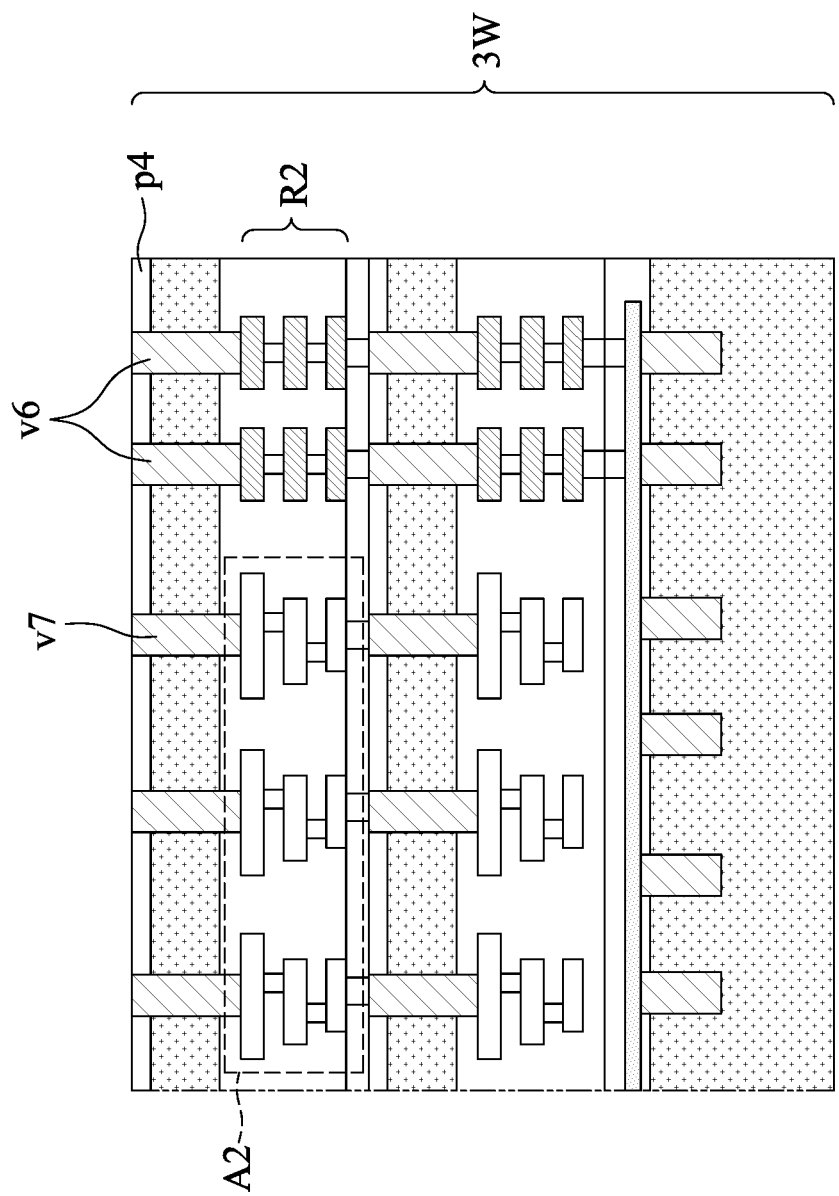
FIG. 5R illustrates one stage of a method of manufacturing a semiconductor structure, in accordance with some embodiments of the present disclosure.

Referring to FIG. 5R, a plurality of TSVs (e.g., the conductive vias v6 and v7) are formed within the trenches 18. Some of the TSVs (e.g., the conductive via v6) are in contact with the seal ring R2. Some of the TSVs (e.g., the conductive via v7) are in contact with at least one layer of the circuit region A2. The semiconductor structure obtained in the operation of FIG. 5R can be referred to as a semiconductor structure 3W. The plurality of TSVs each has a surface exposed by the passivation layer p4.

Figure 5S:
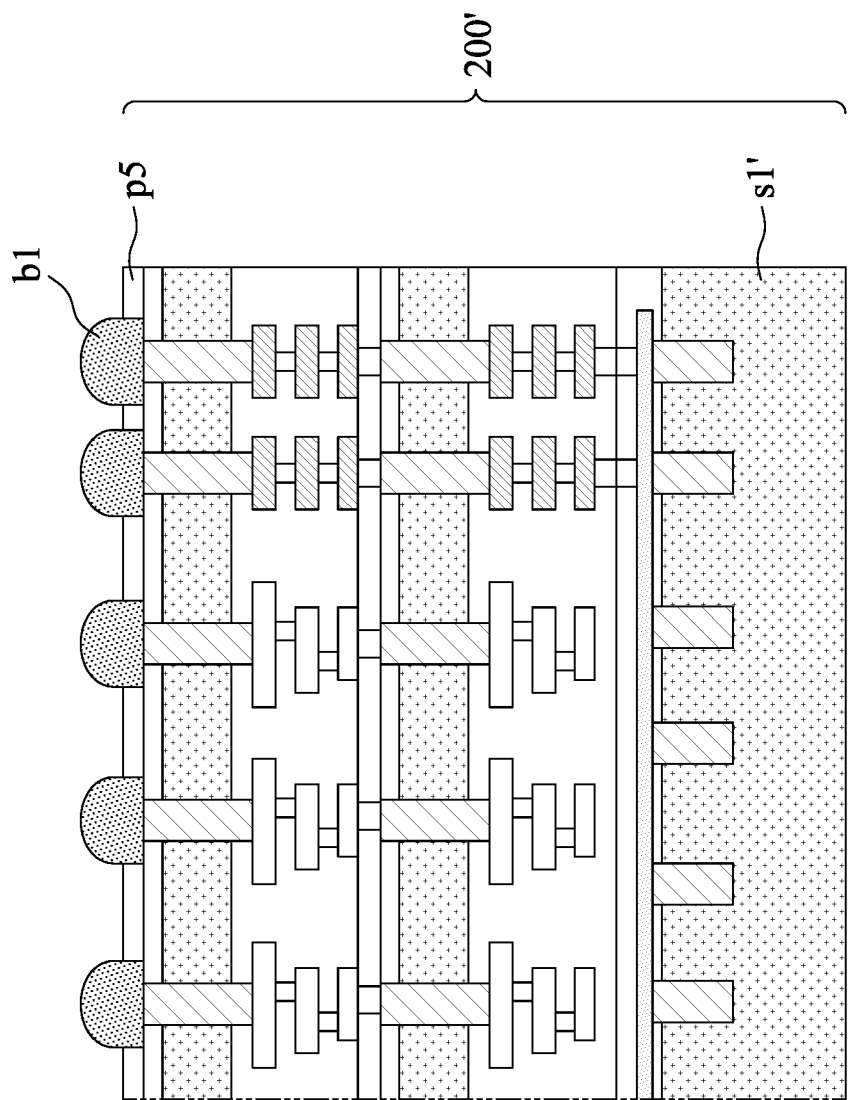
FIG. 5S illustrates one stage of a method of manufacturing a semiconductor structure, in accordance with some embodiments of the present disclosure.

Referring to FIG. 5S, a plurality of conductive bumps b1 are formed in contact with the plurality of TSVs. The plurality of conductive bumps b1 can be thermally in contact with the plurality of TSVs. The plurality of conductive bumps b1 can electrically connect with the plurality of TSVs. In addition, an additional passivation layer p5 is formed above the passivation layer p4. The passivation layer p5 is formed to cover at least a portion of each of the plurality of conductive bumps b1. The plurality of conductive bumps b1 are partially embedded within the passivation layer p5. The plurality of conductive bumps b1 are partially exposed by the passivation layer p5.

The passivation layer p5 may be of one or more suitable dielectric materials such as silicon oxide, silicon nitride, low-k dielectrics such as carbon doped oxides, extremely low-k dielectrics such as porous carbon doped silicon dioxide, combinations thereof, or the like. In some embodiments, the passivation layer p5 may include materials different from those of the passivation layer p4. In some embodiments, the passivation layer p5 may include materials identical to those of the passivation layer p4. The semiconductor structure obtained in the operation of FIG. 5S can be referred to as a semiconductor structure 200'.

Figure 5T:
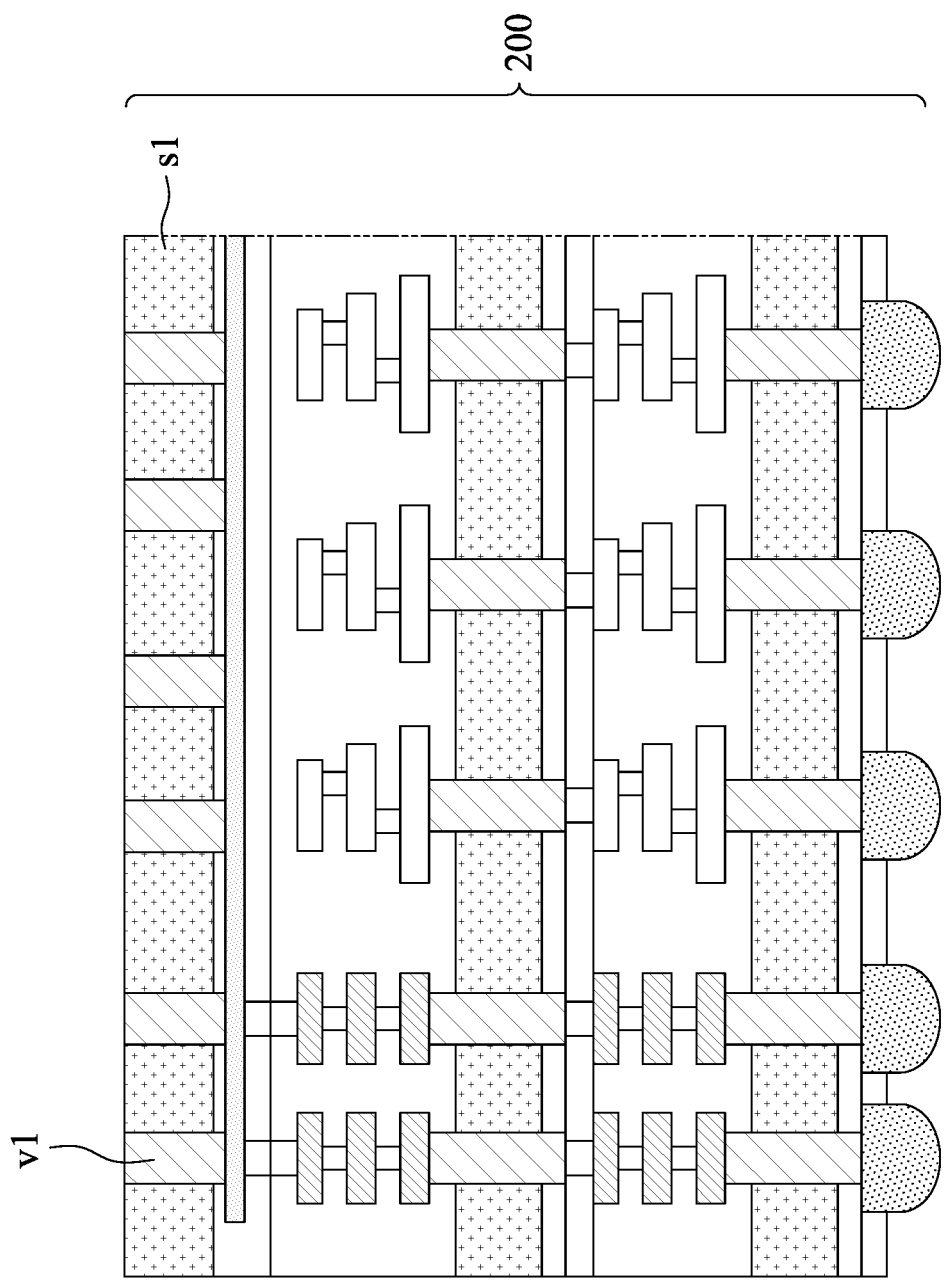
FIG. 5T illustrates one stage of a method of manufacturing a semiconductor structure, in accordance with some embodiments of the present disclosure.

Referring to FIG. 5T, the semiconductor structure 200' obtained at the operation of FIG. 5S is flipped over and then the substrate s1' is thinned to form the substrate s1. The substrate s1' can be thinned by mechanical grinding, chemical mechanical polishing (CMP), wet etching, or atmospheric downstream plasma (ADP) dry chemical etching (DCE). The substrate s1' is thinned until the TSVs (e.g., the conductive via v1) are exposed. The semiconductor structure obtained in the operation of FIG. 5T corresponds to the semiconductor structure 200 shown in FIG. 2.

Figure 6A:
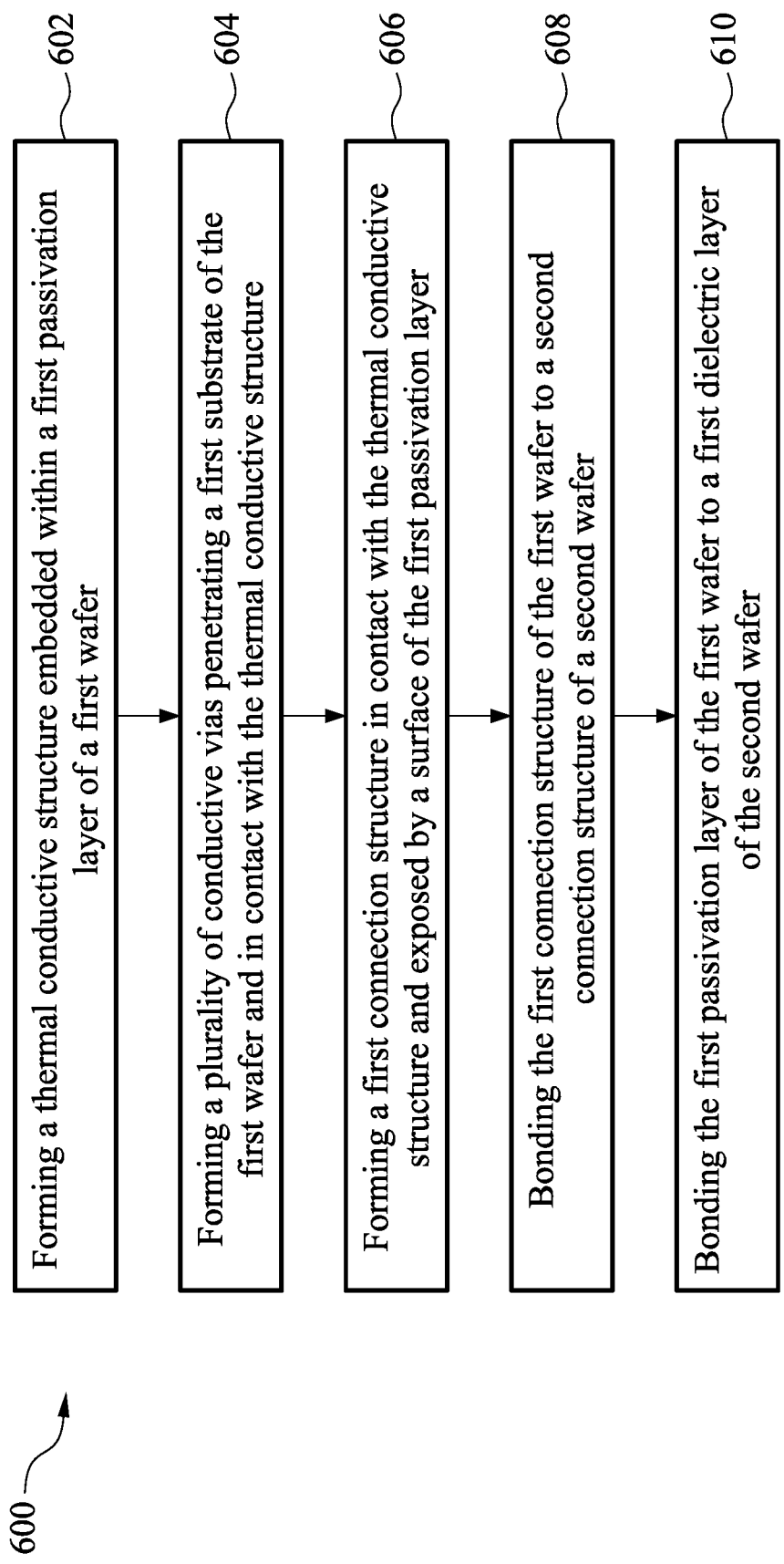
FIGS. 6A and 6B is a flowchart illustrating a method of manufacturing a semiconductor structure, in accordance with some embodiments of the present disclosure.
Figure 6B:
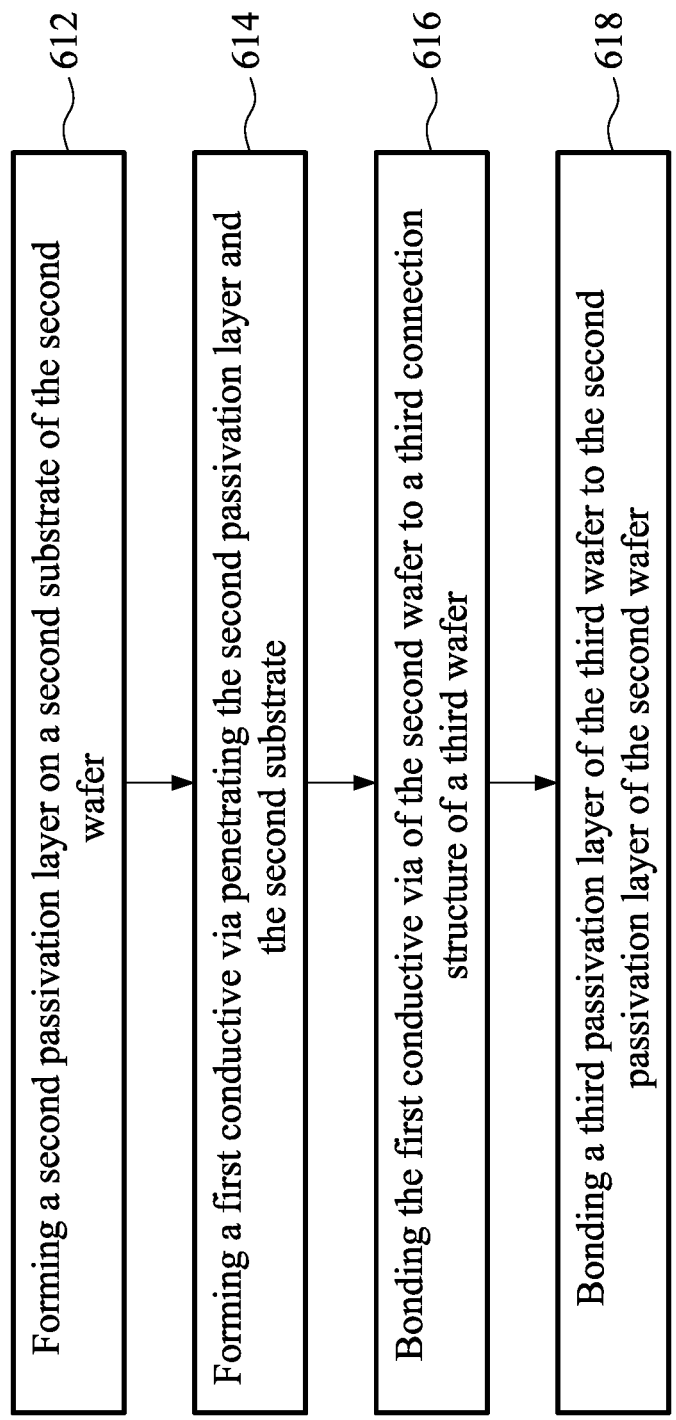

FIGS. 6A and 6B is a flowchart illustrating a method 600 of manufacturing a semiconductor structure, in accordance with some embodiments of the present disclosure.

The method 600 begins with operation 602 in which a thermal conductive structure is formed embedded within a first passivation layer of a first wafer. The operation 602 may, for example, form the thermal conductive structure 10a embedded within the passivation layer p1 of the wafer CW1, as shown in FIG. 2 or FIG. 5C.

The method 600 continues with operation 604 in which a plurality of conductive vias penetrating a first substrate of the first wafer and in contact with the thermal conductive structure are formed. The operation 604 may, for example, form a plurality of conductive vias v1, v2 and v3 penetrating the substrate s1 of the wafer CW1 and in contact with the thermal conductive structure 10a, as shown in FIG. 2.

The method 600 continues with operation 606 in which a first connecting structure in contact with the thermal conductive structure and exposed by a surface of the first passivation layer is formed. The operation 606 may, for example, form a connecting structure c1 in contact with the thermal conductive structure 10a and exposed by a surface p1a of the passivation layer p1, as shown in FIG. 2 or FIG. 5D.

The method 600 continues with operation 608 in which the first connecting structure of the first wafer is bonded to a second connecting structure of a second wafer. The operation 608 may, for example, bond a connecting structure c1 of a first wafer CW1' to a connecting structure c3 of a second wafer DW1', as shown in FIG. 5I.

The method 600 continues with operation 610 in which the first passivation layer of the first wafer is bonded to a first dielectric layer of the second wafer. The operation 610 may, for example, bond the passivation layer p1 of the first wafer CW1' to a dielectric layer d1 of the second wafer DW1', as shown in FIG. 5I. Although the operation 610 is depicted as following operation 608, it can be contemplated that the operation 610 could be performed before the operation 608 or the operations 608 and 610 be performed simultaneously.

The method 600 continues with operation 612 in which a second passivation layer is formed on a second substrate of the second wafer. The operation 612 may, for example, form a passivation layer p2 on a substrate s2 of the wafer DW1', as shown in FIG. 5K.

The method 600 continues with operation 614 in which a first conductive via penetrating the second passivation layer and the second substrate is formed. The operation 614 may, for example, form a conductive via v4 penetrating the passivation layer p2 and the substrate s2, as shown in FIG. 5M.

The method 600 continues with operation 616 in which first conductive via of the second wafer is bonded to a third connecting structure of a third wafer. The operation 616 may, for example, bond a conductive via v4 of the semiconductor structure 2W to a connecting structure c7 of a third wafer DW2', as shown in FIG. 5N.

The method 600 continues with operation 618 in which a third passivation layer (FIG. 5N; p3) of the third wafer is bonded to the second passivation layer (FIG. 5N; p2) of the second wafer. The operation 618 may, for example, bond a passivation layer p3 of the wafer DW2' to the passivation layer p2 of the semiconductor structure 2W, as shown in FIG. 5N. Although the operation 618 is depicted as after the operation 616, it can be contemplated that the operation 618 can be performed before the operation 616, or the operations 616 and 618 can be performed simultaneously.

The method 600 is merely an example, and is not intended to limit the present disclosure beyond what is explicitly recited in the claims. Additional operations can be provided before, during, or after each operations of the method 600, and some operations described can be replaced, eliminated, or reordered for additional embodiments of the method. In some embodiments, the method 600 can include further operations not depicted in FIGS. 6A and 6B. In some embodiments, the method 600 can include one or more operations depicted in FIGS. 6A and 6B.

One aspect of the present disclosure provides a semiconductor structure. The semiconductor structure includes a first substrate, a first dielectric layer disposed on the first substrate, a first passivation layer disposed on the first dielectric layer, a second substrate disposed on the first passivation layer, and a second substrate disposed on the first passivation layer. The semiconductor structure further includes a first seal ring embedded within the first dielectric layer and surrounds a circuit region of the first dielectric layer. The semiconductor structure further include a thermal conductive structure embedded within the first passivation layer, wherein the thermal conductive structure is connected with the first seal ring through a first connecting structure.

Another aspect of the present disclosure provides a semiconductor structure. The semiconductor structure includes a first wafer having a first dielectric layer and a first substrate, and a second wafer bonded to the first wafer and having a first passivation layer and a second substrate, wherein the second wafer comprising a heat dissipation structure in contact with a first seal ring embedded within the first dielectric layer of the first wafer.

Another aspect of the present disclosure provides a method of manufacturing a semiconductor structure having a heat dissipation structure. The method includes forming a thermal conductive structure embedded within a first passivation layer of a first wafer, and forming a plurality of conductive vias penetrating a first substrate of the first wafer and in contact with the thermal conductive structure. The method further includes forming a first connecting structure in contact with the thermal conductive structure and exposed by a surface of the first passivation layer. The method further includes bonding the first connecting structure of the first wafer to a second connecting structure of a second wafer, and bonding the first passivation layer of the first wafer to a first dielectric layer of the second wafer, wherein a first seal ring embedded within the first dielectric layer of the second wafer is thermally connected to the thermal conductive structure through the first connecting structure and the second connecting structure.

In the semiconductor structure proposed in the present disclosure, a heat dissipation structure for a 3D stacked chip package or a wafer-on-wafer structure incorporates the seal rings of individual wafers. The heat dissipation structure as proposed provides an efficient heat dissipation path for each wafer of a 3D stacked chip package or a wafer-on-wafer structure, without introducing additional components or complex structures. Also, the heat dissipation structure as proposed increases the function of the existing seal rings. That is, in addition to the inherent function of the seal ring (i.e., to prevent unintended stress from propagating into the semiconductor element), the heat dissipation structure as proposed utilizes the seal rings for thermal transmission and heat dissipation. The heat dissipation structure as proposed also enhances the structural stability of a 3D stacked chip package or a wafer-on-wafer structure.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a first wafer having a first dielectric layer and a first substrate;
a second wafer bonded to the first wafer and having a first passivation layer and a second substrate, wherein the first passivation layer is sandwiched between the first dielectric layer and the second substrate, wherein the second wafer comprises a heat dissipation structure in contact with a first seal ring embedded within the first dielectric layer of the first wafer; and
a third wafer bonded to the first wafer and having a second dielectric layer and a third substrate, wherein the heat dissipation structure of the second wafer is thermally connected to a third seal ring embedded within the second dielectric layer, and the first wafer comprises a first circuit region surrounded by the first seal ring, and the third wafer comprising a second circuit region surrounded by the third seal ring.

2. The semiconductor structure of claim 1, wherein the heat dissipation structure comprising:
a thermal conductive structure embedded within the first passivation layer and positioned between the first dielectric layer and the second substrate; and
a first conductive via penetrating the second substrate, wherein
a first end of the first conductive via is exposed by a surface of the second substrate; and
a second end of the first conductive via is in contact with the thermal conductive structure, wherein the second end of the first conductive via is embedded within the first passivation layer to contact with the thermal conductive structure.

3. The semiconductor structure of claim 1, further comprising a second seal ring embedded within the first dielectric layer and surrounded by the first seal ring, wherein the second seal ring is connected to the heat dissipation structure through a connecting structure, wherein the first seal ring and the second seal ring are disposed on a same elevation.

4. The semiconductor structure of claim 1, wherein the first circuit region is electrically connected to the second circuit region through a second conductive via penetrating the first substrate, and the thermal conductive structure comprises a mesh profile.

5. The semiconductor structure of claim 2, wherein the thermal conductive structure comprises:
a first rib extending in a first direction;
a second rib spaced apart from the first rib and extending parallel with the first rib; and
a third rib extending in a second direction perpendicular to the first direction,
wherein the first rib, the second rib, and the third rib are embedded within the first passivation layer and positioned between the first dielectric layer and the second substrate;
wherein the heat dissipation structure further comprises a third conductive via landing on an intersection of the third rib and the first rib.

6. The semiconductor structure of claim 1, wherein the first circuit region of the first wafer and the second circuit region of the third wafer are located on opposite sides of the first substrate.

7. The semiconductor structure of claim 1, wherein the heat dissipation structure comprises:
a thermal conductive structure embedded within the first passivation layer; and
a plurality of conductive vias in direct contact with the thermal conductive structure, each of the plurality of conductive vias comprising a first end embedded within the first passivation layer and a second end exposed by a surface of the second substrate, wherein the first end is in contact with the thermal conductive structure.

8. The semiconductor structure of claim 3, wherein the heat dissipation structure comprises a thermal conductive structure embedded within the first passivation layer and having a first rib extending in a first direction, and wherein the first rib is connected to both the first seal ring and the second seal ring.

* * * * *